(12) United States Patent
Mizuno et al.

(10) Patent No.: US 10,088,538 B2
(45) Date of Patent: Oct. 2, 2018

(54) NMR PROBE

(71) Applicant: JEOL Ltd., Tokyo (JP)

(72) Inventors: Takashi Mizuno, Tokyo (JP); Kiyonori Takegoshi, Kyoto (JP); Koji Fujioka, Ibaraki (JP)

(73) Assignee: JEOL Ltd., Tokyo (JP)

( * ) Notice: Subject to any disclaimer, the term of this patent is extended or adjusted under 35 U.S.C. 154(b) by 343 days.

(21) Appl. No.: 15/014,444

(22) Filed: Feb. 3, 2016

(65) Prior Publication Data
US 2016/0231397 A1    Aug. 11, 2016

(30) Foreign Application Priority Data

Feb. 6, 2015    (JP) ................. 2015-022651

(51) Int. Cl.
*G01R 33/36*    (2006.01)
*G01R 33/34*    (2006.01)
*G01R 33/30*    (2006.01)
*G01R 33/31*    (2006.01)

(52) U.S. Cl.
CPC ......... *G01R 33/3628* (2013.01); *G01R 33/30* (2013.01); *G01R 33/3403* (2013.01); *G01R 33/3621* (2013.01); *G01R 33/307* (2013.01); *G01R 33/31* (2013.01); *G01R 33/3635* (2013.01)

(58) Field of Classification Search
CPC ............ G01R 33/3628; G01R 33/3621; G01R 33/3635; G01R 33/3403; G01R 33/30; G01R 33/307; G01R 33/31
See application file for complete search history.

(56) References Cited

U.S. PATENT DOCUMENTS

| 7,358,736 B2 * | 4/2008 | Fukuda .................. G01R 33/30 324/321 |
| 7,701,219 B2 | 4/2010 | Finnigan et al. |
| 9,372,247 B2 * | 6/2016 | Takegoshi ............. G01R 33/31 |
| 2002/0171426 A1 | 11/2002 | Hasegawa |
| 2014/0055138 A1 | 2/2014 | Takegoshi et al. |

FOREIGN PATENT DOCUMENTS

| EP | 2700970 A2 | 2/2014 |
| JP | 200997964 A | 5/2009 |
| JP | 201441103 A | 3/2014 |

* cited by examiner

*Primary Examiner* — Rodney Bonnette
(74) *Attorney, Agent, or Firm* — The Webb Law Firm

(57) ABSTRACT

An inner container including a tube body is provided in an outer container. With this structure, the inside of the outer container is separated into a primary airtight chamber and a sub airtight chamber (upper airtight chamber and lower airtight chamber). A detection circuit is placed in the primary airtight chamber. The detection circuit is a tuning and matching circuit having a transmission and reception coil serving as an NMR detection element and a variable capacitor. An additional member including an additional element such as a capacitor is inserted into the upper airtight chamber, and the additional member is set on a top terminal mounting member and a bottom terminal mounting member. With this structure, the additional element is electrically connected to the detection circuit and a characteristic of the detection circuit is changed.

7 Claims, 20 Drawing Sheets

NMR PROBE

PRIORITY INFORMATION

This application claims priority to Japanese Patent Application No. 2015-022651 filed on Feb. 6, 2015, which is incorporated herein by reference in its entirety.

BACKGROUND

Technical Field

The present invention relates to an NMR (Nuclear Magnetic Resonance) probe, and in particular, to a technique for changing a characteristic of an electronic circuit in an NMR probe.

Related Art

In nuclear magnetic resonance (NMR) apparatuses, an NMR probe (an NMR signal detection probe) is placed along with a sample within a superconductive magnet that generates a static magnetic field. The NMR probe has a transmission and reception coil. The transmission and reception coil has functions to apply a varying RF (radio frequency) magnetic field to the sample during transmission, and to detect an NMR signal of the sample during reception. Because a resonance frequency differs depending on a nuclear species to be observed, in a sample measurement, a high-frequency signal having a frequency adapted to the nuclear species to be observed is supplied to the transmission and reception coil. In general, a detection circuit in the NMR probe includes, in addition to the transmission and reception coil, a variable capacitor for tuning and a variable capacitor for matching. In other words, the detection circuit has a tuning circuit and a matching circuit.

Prior to the sample measurement, tuning for the detection circuit (adjustment of operation conditions) is executed. In other words, the tuning and matching are executed. In order to achieve tuning and matching, a directional coupler is provided on a signal path from the transmission side to the detection circuit, and a reflected wave returning from the detection circuit to the transmission side is observed. A voltage level of the reflected wave changes according to a degree of detuning and a degree of mismatch. Therefore, by changing setting values (capacitances) of the tuning variable capacitor and the matching variable capacitor while referring to the voltage level of the reflected wave, the resonance frequency of the detection circuit is adapted to the resonance frequency corresponding to the nuclear species to be observed, and an impedance of the detection circuit is matched with an impedance at the transmission side.

A frequency range in which the tuning and matching of the detection circuit can be optimized (tuning range) is limited by a range of the capacitance of the variable capacitor, and the nuclear species that can be observed are also limited to nuclear species having resonance frequencies within the tuning range. For example, in a detection circuit having a tuning range of 100 MHz-120 MHz, only nuclear species having resonance frequencies in the frequency range can be measured.

As a technique for changing the tuning range of the detection circuit, U.S. Pat. No. 7,701,219 B discloses a capacitor switch in which a plurality of capacitors having different capacitances are fixed (refer to FIGS. 3A-3C and 4A-4H, and TABLE 1 of this reference). The capacitor switch is provided within the NMR probe, and the capacitor to be connected to the detection circuit can be switched by sliding the capacitor switch. With this process, the capacitance of the capacitor included in the detection circuit is changed, and, as a result, the tuning range is changed.

In the method described in U.S. Pat. No. 7,701,219, because the tuning range is changed using a limited number of capacitors, the tuning ranges that can be handled are limited. For example, a problem may arise in that the tuning range cannot be changed continuously, and the tuning range is discretely set. When the observation target is an organic substance, the number of nuclear species to be observed is not large. Therefore, by preparing capacitors in numbers corresponding to the number of nuclear species, it becomes possible to set a tuning range corresponding to the nuclear species to be observed. However, when the number of nuclear species to be observed is increased, the method described in U.S. Pat. No. 7,701,219 cannot handle the large number of nuclear species. For example, the number of nuclear species is large for inorganic substances, and thus, with the method of switching among a limited number of capacitors, it may not be possible to set a tuning range corresponding to the nuclear species to be observed. In addition, depending on a dielectric constant of the sample, the tuning range may differ for the same nuclear species. In order to handle such cases, a configuration may be considered in which the number of capacitors that may be switched is increased in the capacitor switch described in U.S. Pat. No. 7,701,219. However, a problem arises in that, as the number of capacitors is increased, the size of the NMR probe housing the capacitors is also increased. In addition, in order to handle a larger number of nuclear species, the number of capacitors to be provided becomes enormous, which is not practical. As described, with the method of using a limited number of capacitors, it is difficult to set a tuning range corresponding to an arbitrary nuclear species.

As described, it is desirable that the tuning range can be more flexibly changed corresponding to the nuclear species to be observed. In addition, it is also desirable that, in addition to the tuning range, the characteristics of the electronic circuit provided in the NMR probe can be flexibly changed. During this process, it is desirable that an electronic circuit characteristic such as the tuning range be changed while maintaining a peripheral environment of the electronic circuit provided in the NMR probe. For example, for a cool-type NMR probe, it is desirable that the electronic circuit characteristic be changed while maintaining a cooled state of the peripheral environment of the electronic circuit. Alternatively, when the inside of the NMR probe is maintained at vacuum, it is desirable that the electronic circuit characteristic be changed while maintaining the peripheral environment; that is, the vacuum, of the electronic circuit.

An advantage of the present invention is that, while maintaining a peripheral environment of an electronic circuit provided in an NMR probe as much as possible, a characteristic of the electronic circuit can be freely changed later.

SUMMARY

According to one aspect of the present invention, there is provided an NMR probe comprising: an outer container; an inner container provided in the outer container and that separates an inside of the outer container into a primary space and a sub space serving as a passageway; a basic electronic circuit placed in the primary space and that includes an NMR detection element; and an additional member placed in the sub space in a manner to allow insertion and removal during characteristic change in which a characteristic of the basic electronic circuit is changed, and that has at least one additional element that is electrically connected to the basic electronic circuit in a state of being placed in the sub space.

In the above-described configuration, a primary space and a sub space are formed in an outer container by an inner container, and a double structure is formed within the NMR probe. The basic electronic circuit is placed in the primary space, and the additional member is placed in the sub space. With the double structure, the primary space is spatially isolated from the sub space. Thus, even when the additional member is inserted into the sub space or is removed from the sub space, the environment of the primary space; that is, the peripheral environment of the basic electronic circuit, is basically not affected. As described, according to the above-described configuration, the characteristic of the electronic circuit for NMR detection can be changed by adding or removing the additional member, while maintaining the peripheral environment of the basic electronic circuit. There can be avoided or reduced a problem that the characteristic of the electronic circuit is undesirably significantly changed by an influence of insertion or removal of the additional member, and that it takes a long time to return to the original state.

The NMR detection element is, for example, a transmission and reception coil, and the basic electronic circuit is, for example, a detection circuit having the tuning circuit and the matching circuit. In this case, as the additional element included in the additional member, for example, a capacitor is used. With this configuration, it becomes possible to change the size of the capacitance (capacitor) of the detection circuit. For example, the tuning range of the detection circuit can be changed. The additional element included in the additional member is not limited to the capacitor. The additional element included in the additional member is not limited to a passive element such as a capacitor, and an active element may be used.

According to another aspect of the present invention, preferably, the primary space is formed as an airtight space, and the NMR probe further comprises a cooling mechanism that cools the basic electronic circuit and the additional member. In this configuration, the basic electronic circuit is cooled. Because the primary space is isolated from the sub space, even when the additional member is inserted or removed, the cooled state of the basic electronic circuit is basically maintained. In addition, the airtightness of the peripheral environment of the basic electronic circuit is also maintained.

According to another aspect of the present invention, preferably, the NMR probe further comprises a plug provided at an entrance/exit of the sub space and that opens and closes the entrance/exit; and a gate provided in the sub space between a holding position of the additional member and the entrance/exit and that opens and closes partway in the sub space, wherein in its closed state the gate separates the sub space into a first space having the holding position and a second space on the entrance/exit side. In this configuration, the sub space is separated into the first space and the second space by the gate. Because of this, when the plug is removed in a state where the gate is closed, the second space is opened to the atmosphere. Because the gate is in a closed state, the first space is not opened to the atmosphere. In this manner, the sub space is partially opened to the atmosphere. With this configuration, it becomes possible to avoid flow-in of the atmospheric air directly into the first space in which the additional member is placed. For example, when the first space is maintained at vacuum, the vacuum state can be maintained.

According to another aspect of the present invention, preferably, the NMR probe further comprises: a first suctioning unit that suctions an inside of the first space, and a second suctioning unit that suctions an inside of the second space. According to this configuration, the characteristic of the basic electronic circuit can be changed while maintaining the vacuum of the first space.

According to another aspect of the present invention, preferably, the additional member includes a body, a one-side electrode, and an other-side electrode, and the NMR probe further comprises: a one-side connection member that connects the one-side electrode to a first connection point of the basic electronic circuit in a state where the additional member is placed in a holding position in the sub space; and an other-side connection member that connects the other-side electrode to a second connection point of the basic electronic circuit in a state where the additional member is placed in the holding position. According to this configuration, when the additional member is set at the holding position, the additional member and the basic electronic circuit are connected to each other simultaneously with the setting of the additional member. When the additional member is removed, the additional member is disconnected from the basic electronic circuit simultaneously with the removal of the additional member, and a non-connection state is realized.

According to another aspect of the present invention, preferably, the NMR probe further comprises a plug that blocks an entrance/exit of the sub space while allowing movement of the additional member within the sub space in a state where the additional member is inserted into the sub space. According to this configuration, when the additional member is inserted into the sub space, the sub space is disconnected from the atmosphere. With this process, during the insertion of the additional member also, for example, a pressure of the sub space may be reduced to realize a vacuum state.

According to another aspect of the present invention, preferably, the NMR probe comprises a plurality of the inner containers, a plurality of the sub spaces are formed by the plurality of the inner containers, and the additional member is placed in a manner to allow insertion and removal in each of the plurality of the sub spaces.

According to various aspects of the present invention, the characteristic of the electronic circuit can be freely changed later while maintaining the peripheral environment of the electronic circuit placed in the NMR probe as much as possible.

BRIEF DESCRIPTION OF THE DRAWINGS

The present invention will be further described with reference to the accompanying drawings, wherein like reference numerals refer to like parts in the several views, and wherein.

DESCRIPTION OF EXEMPLARY EMBODIMENTS

[First Preferred Embodiment]

Figure 1:
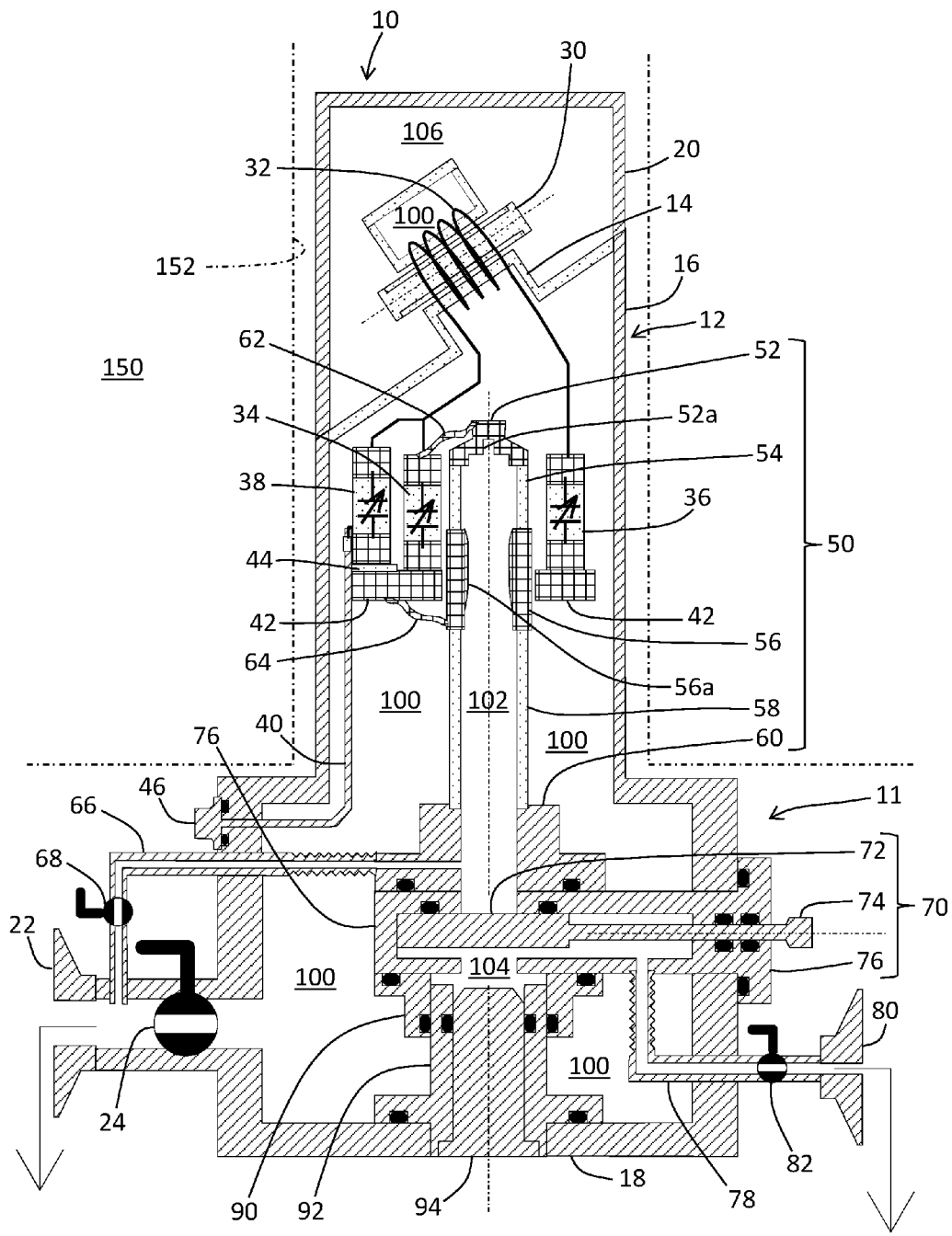
FIG. 1 is a cross sectional diagram showing an NMR probe according to a first preferred embodiment of the present invention.

FIG. 1 shows an NMR probe (detection system cool-type NMR probe) according to a first preferred embodiment of the present invention. This NMR probe is used, for example, when analyzing a molecular structure of a sample. In the present embodiment, the sample may be any of solid, gas, and liquid.

The NMR probe according to the first preferred embodiment comprises an insertion section 10 and a lower unit 11. The insertion section 10 has an overall tubular shape extending in a vertical direction, and is inserted into a bore 152 of a static magnetic field generation apparatus 150. The NMR probe comprises an outer container 12, an inner container (container including a tube body 50) provided in the outer container 12, and a tank circuit (detection circuit) having a transmission and reception coil 32. A space inside the outer container 12 is separated by the inner container into a primary airtight chamber 100 and a sub airtight chamber (an upper airtight chamber 102 and a lower airtight chamber 104). With this configuration, a double structure is formed in the outer container 12. The tank circuit is placed in the primary airtight chamber 100, and an additional member for changing a characteristic of the tank circuit is placed in the upper airtight chamber 102. Each of the constituting elements of the NMR probe will now be described.

The outer container 12 is a container having a probe head partition 14, a probe tubular section partition 16, and a probe lower partition 18. The primary airtight chamber 100 is a space surrounded by the outer container 12 and a primary valve 24. The inside of the primary airtight chamber 100 is in a vacuum state, and the outside thereof is in the atmospheric pressure state. A pressure of the inside of the primary airtight chamber 100 is reduced to, for example, a pressure of less than or equal to $10^{-3}$ Pa.

On an upper part of the probe head partition 14, a probe cap 20 is provided. The probe cap 20 is a tubular member provided at an uppermost section of the insertion section 10. As an example, the probe cap 20 is formed from a metal conductor (for example, aluminum). The probe cap 20 is electrically and mechanically connected at its lower part to the probe tubular section partition 16. With this configuration, influence of electromagnetic waves such as external noise on the transmission and reception coil 32 is prevented or reduced. As an example, the connection between the probe cap 20 and the probe tubular section partition 16 does not have airtightness. Thus, a space 106 surrounded by the probe cap 20 and the probe head partition 14 is an atmospheric space.

The probe head partition 14 is a member that isolates the transmission and reception coil 32 from the atmospheric space, to secure airtightness of the upper part of the insertion section 10. The probe head partition 14 is formed from, for example, a composite member. As an example, the probe head partition 14 is formed from GFRP (glass fiber reinforced plastic) or ceramic which is an insulating material. The probe head partition 14 is airtightly connected with the probe tubular section partition 16 at its lower end surface.

The probe tubular section partition 16 is, for example, a partition having a tubular shape. When the insertion section 10 is mounted in the bore 152 of the static magnetic field generation apparatus 150, the probe tubular section partition 16 is not placed at a position that can be accessed from the outside. The probe tubular section partition 16 is airtightly connected with the probe head partition 14 at its upper end surface, and is airtightly connected with the probe lower partition 18 at its lower end surface.

The probe lower partition 18 is, for example, a box-shaped partition. When the insertion section 10 is mounted in the bore 152 of the static magnetic field generation apparatus 150, the probe lower partition 18 is placed at a position accessible from the outside. The probe lower partition 18 is airtightly connected with the probe tubular section partition 16 at its upper end surface.

A primary vacuum port 22 is provided on the probe lower partition 18. A pressure-reduction line such as a vacuum pump is attached to the primary vacuum port 22.

The primary valve 24 is a valve provided between the pressure-reduction line such as the vacuum pump connected to the primary vacuum port 22 and the primary airtight chamber 100. As an example, the primary valve 24 is a two-port, manual valve. Alternatively, the primary valve 24 may be a valve of another type. By operating the primary valve 24, the primary airtight chamber 100 and the pressure-reduction line can be pneumatically connected or disconnected. For the vacuum pump, for example, a turbo molecular pump is used.

At an upper part of the primary airtight chamber 100, a tank circuit is provided. The tank circuit is a detection circuit, and includes, in addition to the transmission and reception coil 32, a variable capacitor for tuning, a variable capacitor for matching, etc. In other words, the tank circuit includes a tuning circuit and a matching circuit. In the first preferred embodiment, the tank circuit includes the transmission and reception coil 32, a tuning variable capacitor 34, a balancing variable capacitor 36, and a matching variable capacitor 38. For example, the tuning circuit and the matching circuit are not independent from each other, and, the circuits are in a relationship where, when an operation condition of one of the circuits is changed, an operation condition of the other of the circuits is also changed. A structure of the tank circuit will now be described.

The transmission and reception coil 32 generates a varying RF magnetic field during transmission, and detects an NMR signal of a sample during reception. Alternatively, a transmission coil and a reception coil which are separate entities may be provided in place of the transmission and reception coil 32. As will be described below, the tank circuit has a variable capacitor for tuning and a variable capacitor for matching, and an operation characteristic of the detection circuit is optimized; that is, the frequency tuning and impedance matching are achieved, by changing the capacitances.

The insertion section 10 is placed in the bore 152 of the static magnetic field generation apparatus 150 so that a center of the sample and a sample tube 30 coincides with a center of the magnetic field. The sample and the sample tube 30 are placed in the space 106 (in an atmospheric space) surrounded by the probe cap 20 and the probe head partition 14. When the sample to be measured is solid, the sample tube 30 is placed in a rotatable manner in an inclined orientation with a predetermined inclination angle (so-called magic angle; that is, about 54.7°). In the NMR probe, an air bearing-type rotation mechanism (not shown) is provided. The sample tube 30 is rotated by supplying compressed air (having a pressure of, for example, 0.2 MPa-0.4 MPa) to the air bearing-type rotation mechanism. As an example, the sample tube 30 is rotated at a rotation speed of a few kHz to a few tens of kHz. Alternatively, the sample may be gas or liquid.

The transmission and reception coil 32 is placed in the primary airtight chamber 100 under a pressure-reduced vacuum, in a manner to surround the sample and the sample tube 30. The transmission and reception coil 32 has, for example, the shape of a solenoid. One end of the transmission and reception coil 32 is electrically connected to an upper terminal of the tuning variable capacitor 34. The other end of the transmission and reception coil 32 is electrically connected to an upper terminal of the balancing variable capacitor 36.

The upper terminal of the tuning variable capacitor 34 is electrically connected to an upper terminal of the matching variable capacitor 38. A lower terminal of the matching variable capacitor is electrically connected to an upper end of a transmission path 40. The transmission path 40 is formed from, for example, a coaxial cable.

The tuning variable capacitor 34, the balancing variable capacitor 36, and the matching variable capacitor 38 are formed from, for example, a tubular dielectric, and have electrodes on upper ends and lower ends thereof. In an inner space of the tube, there is provided a metal tube which slides in a vertical direction by rotation even when the member temperature changes from room temperature to a very low temperature. The metal tube is electrically connected to the electrode on the lower end. As the variable capacitor, for example, a capacitor having a model number of "NMCB10-5CKE" manufactured by Voltronics Corporation may be used. Alternatively, the three variable capacitors may have different structures from those described above.

The tuning variable capacitor 34 and the balancing variable capacitor 36 are electrically connected to, mechanically supported by, and fixed on a stage 42 at their respective lower ends. The matching capacitor 38 is electrically insulated from the stage 42 with an insulating base 44 therebetween, and mechanically supported by and fixed on the stage 42. Setting values (capacitances) of the three variable capacitors can be continuously changed from the outside of the NMR probe using an adjustment bar (not shown). With such a configuration, frequency tuning and impedance matching are achieved.

Next, a structure of the inner container will be described. In the first preferred embodiment, the inner container has a single tube body structure. The inner container is provided in the outer container 12, and extends from a bottom of the primary airtight chamber 100 to a region near the tank circuit positioned at an upper part of the primary airtight chamber 100.

A sub airtight chamber which exists independent from the primary airtight chamber 100 is formed inside the inner container. In this manner, the inner container is a container that separates the inside of the outer container 12 into the primary airtight chamber 100 and the sub airtight chamber.

The sub airtight chamber is a space (passageway) for transporting an additional member (element to be exchanged) to be described later from outside of the NMR probe (atmospheric space) into the NMR probe and placing the additional member in the NMR probe. The sub airtight chamber is separated by a valve or the like into the upper airtight chamber 102 and the lower airtight chamber 104.

The inner container includes three member groups (an upper partition, a middle partition, and a lower partition). The lower partition is placed and fixed above the inner side of the probe lower partition 18. The middle partition is placed and fixed above the lower partition. The upper partition is placed and fixed above the middle partition. The member groups are connected or fixed to each other via O-ring seals (portions in FIG. 1 filled in by black color). The middle partition and the lower partition form the partition of the lower airtight chamber 104. The upper partition and the middle partition form the partition of the upper airtight chamber 102. In the following, the structure of each of the upper partition, the middle partition, and the lower partition will be described.

First, the upper partition will be described. The upper partition includes the tube body 50, an upper link 62, a lower link 64, an upper aeration tube 66, and an upper valve 68. The upper partition pneumatically disconnects the upper airtight chamber 102 from the primary airtight chamber 100.

The tube body 50 is a composite member in which a plurality of members having tubular shapes and approximately the same inner size (from top to bottom, a top terminal mounting member 52, an upper insulating tube 54, a bottom terminal mounting member 56, a lower insulating tube 58, and an upper cylinder 60) are overlapped and integrated. The tube body 50 has at its inside a circular column shaped space having an upper end closed and a lower end opened. This space corresponds to the upper airtight chamber 102. The circular column shaped space (upper airtight chamber 102) has an approximately constant diameter. The diameter of this space is slightly larger than an outer size of the additional member to be described later. With such a configuration, the additional member can move within the upper airtight chamber 102. The tube body 50 has functions to mechanically hold the additional member inserted from the outside of the NMR probe and to electrically connect the additional member to the tank circuit.

The top terminal mounting member 52 is a circular column shaped member. On an inner side of a lower end surface of the top terminal mounting member 52, a recess 52a having a leaf spring structure is formed. To the recess 52a, a terminal included in the additional member to be described later is fitted. A lower end surface of the top terminal mounting member 52 is airtightly fixed on the upper end surface of the upper insulating tube 54 by adhesion. In order to maintain a surface resistance and a connection point resistance low, the top terminal mounting member 52 may be gold-plate processed with, for example, oxygen-free copper.

The upper insulating tube 54 is a member having a tubular shape with a relatively short length. An upper end surface of the upper insulating tube 54 is airtightly fixed on the lower end surface of the top terminal mounting member 52 by adhesion. A lower end surface of the upper insulating tube 54 is airtightly fixed on an upper end surface of the bottom terminal mounting member 56 by adhesion. In order to electrically and thermally insulate between the top terminal mounting member 52 and the bottom terminal mounting member 56, the upper insulating tube 54 is formed from, for example, GFRP or ceramic.

The bottom terminal mounting member 56 is a tube shaped member. On an inner circumferential surface of the tube, a leaf spring 56a is provided. The additional member to be described below is sandwiched and held by the leaf spring 56a. The upper end surface of the bottom terminal mounting member 56 is airtightly fixed on the lower end surface of the upper insulating tube 54 by adhesion. A lower end surface of the bottom terminal mounting member 56 is adhered to an upper end of the lower insulating tube 58. In order to maintain the surface resistance and the connection point resistance low, the bottom terminal mounting member 56 may be gold-plate processed with, for example, oxygen-free copper.

The lower insulating tube 58 is a tube shaped member having a relatively long length. The lower insulating tube 58 corresponds to an intermediate tubular section of the NMR probe. The upper end surface of the lower insulating tube 58 is airtightly fixed on the lower end surface of the bottom terminal mounting member 56 by adhesion. A lower end surface of the lower insulating tube 58 is airtightly fixed on an upper surface of the upper cylinder 60 by adhesion. In order to electrically and thermally insulate between the bottom terminal mounting member 56 and the upper cylinder 60, the lower insulating tube 58 is formed from, for example, GFRP or ceramic.

The lower insulating tube 58 is inserted into a strong magnetic field (for example, greater than or equal to 10-20 Tesla). In order to avoid stress load caused by the magnetic field from being applied to the lower insulating tube 58 and to prevent distortion of uniformity of the magnetic field at the center of the magnetic field, the lower insulating tube 58 is preferably formed from a non-magnetic material. In addition, the lower end of the lower insulating tube 58 is at room temperature and the upper end is at the very low temperature. Therefore, in order to maintain the temperature difference, the lower insulating tube 58 is preferably formed from a thermally insulating material. In addition, the lower insulating tube 58 preferably has vacuum airtightness. Furthermore, the lower insulating tube 58 is adjacent to an inside structure (heat exchanger and helium pipe) made of gold-plated copper, for example, and a radiation shield is placed around the lower insulating tube 58. If the lower insulating tube 58 has electrical conductance, an unnecessary harmonic coupling would be caused. In order to prevent this, the lower insulating tube 58 is preferably formed from an electrically insulating material. In addition, because there is a possibility of application of a load on the lower insulating tube 58 during attachment or detachment of the additional member, the lower insulating tube 58 preferably has rigidity, rather than flexibility. Moreover, because the lower insulating tube 58 is placed in a space of a high degree of vacuum, the lower insulating tube 58 is preferably formed from a low gas discharging material. Examples of materials satisfying these conditions include a resin, a ceramic, a composite material, or the like. For example, GFRP as described above is preferably used.

The upper cylinder 60 is a protruded member, and is placed so that the protrusion faces upward. In addition, the upper cylinder 60 has a vertical through hole having a tubular shape. In order not to affect the uniformity of the magnetic field, the upper cylinder 60 is formed from, for example, a non-magnetic stainless steel material. The upper end surface of the upper cylinder 60 is airtightly fixed on the lower end surface of the lower insulating tube 58 by adhesion. A lower end flange surface of the upper cylinder 60 is mechanically fixed on an upper outer surface of a gate valve housing 76 via an O-ring seal. With such a configuration, airtightness is secured.

On the upper end surface of the top terminal mounting member 52, the upper link 62 is provided. The upper link 62 is a plate-shaped member, and electrically connects between the upper end surface of the top terminal mounting member 52 and the terminal of the tuning variable capacitor 34. In order to reduce application of a force pulling the stage 42 downward by a contraction stress acting on the tube body 50 when the tank circuit is cooled, the upper link 62 is preferably formed from, for example, a gold-plated copper foil having plasticity (for example, having a thickness of 0.05 mm-0.1 mm).

On an outer circumferential surface of the bottom terminal mounting member 56, the lower link 64 is provided. The lower link 64 is a plate-shaped member, and electrically connects between the outer circumferential surface of the bottom terminal mounting member 56 and the stage 42. With this configuration, the bottom terminal mounting member 56 and the tuning variable capacitor 34 are electrically connected to each other. In order to reduce application of a force pulling the stage 42 downward by a contraction stress acting on the tube body 50 when the tank circuit is cooled, the lower link 64 is preferably formed from, for example, a gold-plated copper foil having plasticity (for example, having a thickness of 0.05 mm-0.1 mm).

The upper aeration tube 66 is, for example, a flexible tube (for example, a bellows tube). One end of the upper aeration tube 66 is airtightly joined with the inner side space of the upper cylinder 60; that is, the upper airtight chamber 102, and the other end of the upper aeration tube 66 is opened to the primary airtight chamber 100.

The upper valve 68 is a valve airtightly placed on the upper aeration tube 66. The upper valve 68 is, as an example, a two-port manual valve. Alternatively, the upper valve 68 may be a valve of another type. By operating the upper valve 68, it is possible to connect or disconnect the aeration line of the upper aeration tube 66.

Next, the middle partition will be described. The middle partition includes a gate valve 70, a lower aeration tube 78, and a lower valve 82. The middle partition pneumatically disconnects or connects the upper airtight chamber 102 and the lower airtight chamber 104 by a mechanical operation.

The gate valve 70 is a composite member including a gate 72, a lever 74, and a gate valve housing 76.

At an upper part, the gate valve housing 76 is mechanically fixed on the upper cylinder 60 included in the upper partition via an O-ring seal. With such a configuration, the airtightness is secured. At a lower part, the gate valve housing 76 is mechanically fixed on a middle cylinder 90 included in the lower partition via an O-ring seal. With such a configuration, the airtightness is secured. A user can pneumatically connect or disconnect between the upper airtight chamber 102 and the lower airtight chamber 104 by sliding the gate 72 via the lever 74.

The gate 72 is a plate-shaped member placed inside the gate valve housing 76. The gate 72 has, for example, the shape of a rectangle. The gate 72 is formed from, for example, a non-magnetic stainless steel material. An upper surface of the gate 72 is a flange surface. When the gate 72 is slid to the deepest position, the gate 72 is pressed against an O-ring seal placed inside the upper surface of the gate valve housing 76. With this process, the upper airtight chamber 102 and the lower airtight chamber 104 are pneumatically disconnected from each other.

The lever 74 is, for example, a round bar, and is provided through a through hole of a double O-ring seal placed at the atmosphere side of the gate valve housing 76. One end of the lever 74 protrudes to the atmosphere side. The other end of the lever 74 is mechanically connected to a side surface of the gate 72 at the inside of the gate valve housing 76. The lever 74 is formed from, for example, a non-magnetic stainless steel material.

The gate valve housing 76 is a rectangular parallelepiped shaped box having a flange surface. In the inside space of the gate valve housing 76, the gate 72 and a part of the lever 74 mechanically connected to the gate 72 are stored. The gate valve housing 76 is formed from, for example, a non-magnetic stainless steel material. The gate valve housing 76 is inserted from a side surface of the NMR probe in a lateral direction, and is fixed at the flange surface with respect to the side surface of the NMR probe via an O-ring seal. The gate valve housing 76 has a vertical through hole having a tubular shape at a deeper position. The through hole is placed coaxial with the through hole of the upper cylinder 60 and the through hole of the middle cylinder 90. A hole size of the through hole of the gate valve housing 76 is larger than an outer size of the additional member to be described later (element to be exchanged), and is a size that allows the additional member to pass without an obstruction. The hole size of the through hole of the gate valve housing 76 is also smaller than the outer size of a transporting container to be described later. With such a configuration, the transporting container cannot pass through the gate valve housing 76.

The lower aeration tube 78 is, for example, a flexible tube (for example, a bellows tube). One end of the lower aeration tube 78 is airtightly joined to the inside of the gate valve housing 76. The other end of the lower aeration tube 78 is connected to a sub vacuum port 80 placed outside of the NMR probe. The lower aeration tube 78 is formed from, for example, a non-magnetic stainless steel material.

The sub vacuum port 80 is placed outside of the NMR probe, and a pressure-reduction line such as a vacuum pump is attached thereto. As the vacuum pump, for example, a turbo molecular pump is used.

The lower valve 82 is a valve airtightly placed on the lower aeration tube 78. The lower valve 82 is, as an example, a two-port manual valve. Alternatively, the lower valve 82 may be a valve of another type. By operating the lower valve 82, it is possible to connect or disconnect the aeration line of the lower aeration tube 78.

Next, the lower partition will be described. The lower partition includes the middle cylinder 90, a lower cylinder 92, and an insertion hole plug 94. The lower partition pneumatically disconnects the lower airtight chamber 104 from the atmosphere.

The middle cylinder 90 is a protruded member, and is placed such that the protrusion faces downward. In addition, the middle cylinder 90 has a vertical through hole having a tubular shape. The middle cylinder 90 is formed from, for example, a non-magnetic stainless steel material. At an upper part, the middle cylinder 90 is mechanically fixed on the gate valve housing 76 included in the middle partition via an O-ring seal. With such a configuration, airtightness is secured. On an inner circumferential surface at a lower part of the middle cylinder 90, a groove for the O-ring is formed, and the O-ring seal is provided in the groove. When the lower cylinder 92 is inserted into the through hole of the middle cylinder 90, the inner circumferential surface of the middle cylinder 90 is airtightly connected to the outer circumferential surface of the lower cylinder 92 via the O-ring seal. With such a configuration, the airtightness is secured.

The lower cylinder 92 is a protruded member, and is placed such that the protrusion faces upward. The lower cylinder 92 has a vertical through hole having a tubular shape. The lower cylinder 92 is formed from, for example, a non-magnetic stainless steel material. At a lower part, the lower cylinder 92 is mechanically fixed on the inner side of the bottom surface of the probe lower partition 18 via an O-ring seal. With such a configuration, airtightness is secured. On an upper part of an inner circumferential surface of the lower cylinder 92, a groove for an O-ring is formed, and an O-ring seal is provided in the groove. When the insertion hole plug 94 is inserted to the through hole of the lower cylinder 92, the inner circumferential surface of the lower cylinder 92 is airtightly connected to an outer circumferential surface of the insertion hole plug 94 via the O-ring seal. On a lower part of the inner circumferential surface of the lower cylinder 92, a thread groove for fixing the insertion hole plug 94 is formed. On a lower part of the outer circumferential surface of the insertion hole plug 94, a thread groove corresponding to the thread groove of the lower cylinder 92 is formed. In addition, a hole size of the through hole of the lower cylinder 92 is slightly larger than an outer size of the transporting container to be described later. With such a configuration, the transporting container is inserted into the through hole of the lower cylinder 92. The inner circumferential surface of the lower cylinder 92 is airtightly connected to the outer circumferential surface of the transporting container via an O-ring seal.

The insertion hole plug 94 is, for example, a circular column shaped member. An upper part of the outer circumferential surface of the insertion hole plug 94 is formed smoothly. At a lower part of the outer circumferential surface, a thread groove is formed. The thread groove corresponds to the thread groove formed on the lower cylinder 92 as described above. The insertion hole plug 94 is formed from, for example, a non-magnetic stainless steel material. On a bottom surface of the insertion hole plug 94, for example, a dial section is provided. It is possible to pneumatically connect or disconnect between the atmosphere and the lower airtight chamber 104 by rotationally operating the insertion hole plug 94 from outside of the NMR probe.

In the above-described structure, the tank circuit (the transmission and reception coil 32 and variable capacitors), the top terminal mounting member 52, the upper insulating tube 54, the bottom terminal mounting member 56, and a region of the lower insulating tube 58 near the joint with the bottom terminal mounting member 56 are cooled to the very low temperature. These elements correspond to members to be cooled, and are cooled by a cooling mechanism (not shown). In order to improve an S/N ratio of the signal, the variable capacitor must be cooled to a low temperature along with the transmission and reception coil, and the variable capacitor is placed near the transmission and reception coil 32. In the present preferred embodiment, because the transmission and reception coil 32 is placed at an upper part of the insertion section 10, the variable capacitors are also placed at the upper part of the insertion section 10. As the cooling mechanism, for example, a cooling system described in JP 2014-41103 A (cryostat cooling system) may be used. More specifically, for example, liquid helium is introduced into a heat exchanger (not shown), and the heat exchanger is cooled to a very low temperature (for example, less than or equal to 20K). The heat exchanger is connected to the members to be cooled through heat links (not shown), and the members to be cooled are thus cooled. In the NMR probe, a temperature sensor (not shown) is attached, and the temperatures of the members to be cooled or the like are detected by the temperature sensor.

During the low-temperature operation, the size of the members to be cooled is contracted as compared to the condition under the room temperature according to a linear expansion coefficient of the material. In the present preferred embodiment, of the members to be cooled, a contraction reference point for the group of members fixed on the stage 42 (the variable capacitors and the transmission and reception coil 32) is at an upper part of the insertion section 10, and, during the low-temperature operation, the stage 42 is displaced upward. An amount of displacement is, for example, about 0.5 mm-1 mm.

When the bottom terminal mounting member 56 included in the tube body 50 is fixed on the stage 42, the following disadvantage may arise. The contraction reference point of the lower insulating tube 58 of the tube body 50 is the joint section with the upper cylinder 60, which is at room temperature. A temperature gradient is caused in the lower insulating tube 58, the lower insulating tube 58 is thus contracted, and a stress pulling the stage 42 downward is generated. Therefore, the positions of the stage 42 and the transmission and reception coil 32 in the height direction attempt to move to a lower position than the initial state where the entire structure is at room temperature. For example, a mechanical technique for maintaining the position of the transmission and reception coil 32 at a constant position during the low-temperature operation is employed. In this case, as a result, the contraction stress acting on the lower insulating tube 58 causes a mechanical distortion on the stage 42 and the mechanism and members around the stage. In order to avoid this, the tube body 50 is mechanically fixed only to the probe lower partition 18 through the mechanical fixation to the middle partition and the lower partition, and is not mechanically fixed to the stage 42. In addition, the top terminal mounting member 52 and the tank circuit are electrically connected to each other by the upper link 62, and the bottom terminal mounting member 56 and the tank circuit are electrically connected to each other by the lower link 64. With such a configuration, it is possible to avoid the above-described mechanical disadvantage.

Figure 2A:
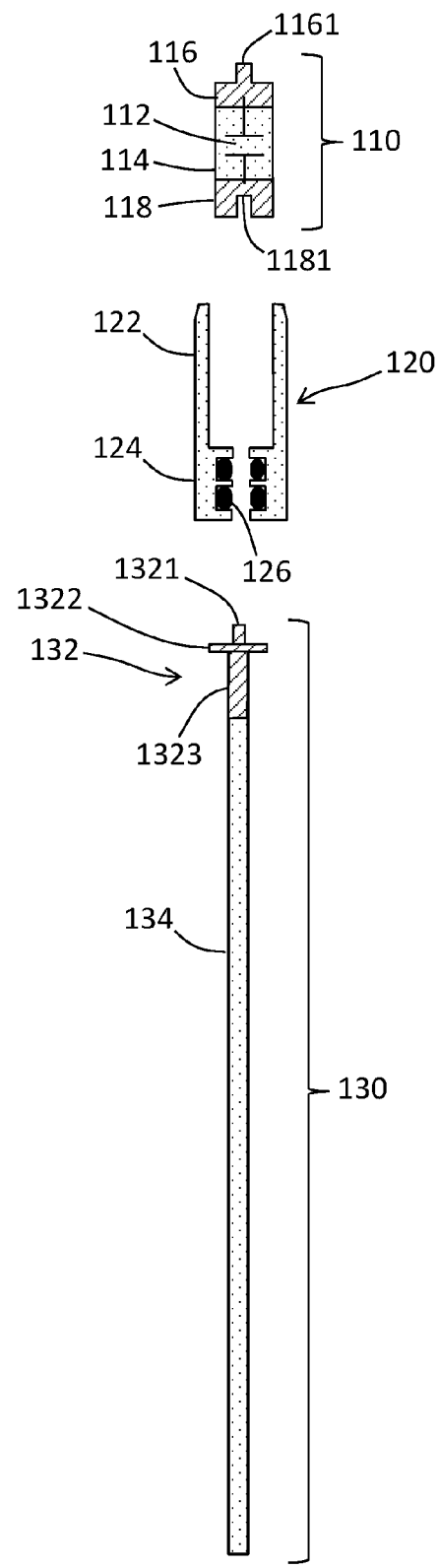
FIG. 2A is a cross sectional diagram showing an example of an additional member transporting unit including an additional member.
Figure 2B:
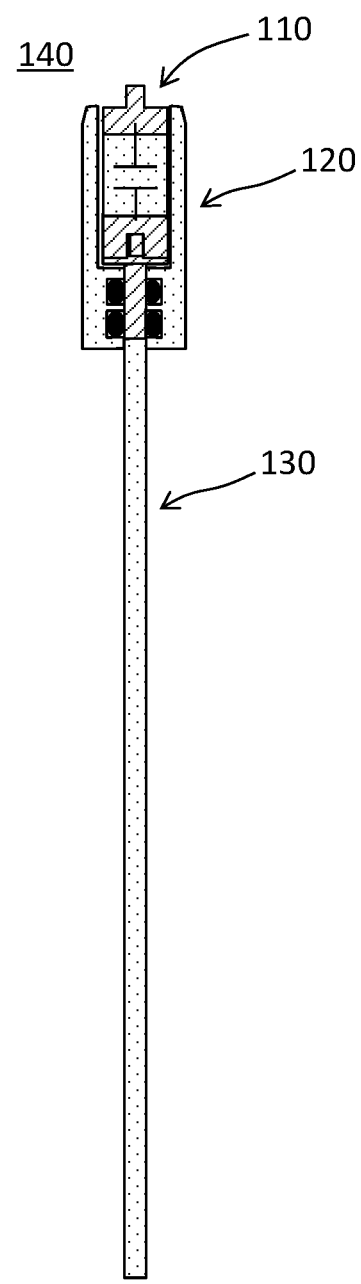
FIG. 2B is a cross sectional diagram showing an example of the additional member transporting unit including the additional member.

Next, with reference to FIGS. 2A and 2B, the additional member inserted to the NMR probe will be described. FIG. 2A shows an example of an additional member 110 which is an element to be exchanged, a transporting container 120, and a stick 130. FIGS. 2A and 2B are cross sectional diagrams of the additional member 110, the transporting container 120, and the stick 130.

The additional member 110 is a composite member including an additional element 112, a holding structure 114, a top terminal 116, and a bottom terminal 118. The additional element 112 is provided in the holding structure 114. The holding structure 114 is sandwiched from above and below by the top terminal 116 and the bottom terminal 118. The top terminal 116 and the bottom terminal 118 function as electrodes. The members of the additional member 110 have, for example, a circular column shape, and the outer sizes of the members are the same. The outer size is, as an example, 7 mm-10 mm. The outer size of the additional member 110 is slightly smaller than the hole size of the upper airtight chamber 102 and the hole size of the through hole of the gate valve housing 76. With such a configuration, the additional member 110 can be inserted into the upper airtight chamber 102 through the gate valve housing 76, and the additional member 110 can be moved within the upper airtight chamber 102.

The top terminal 116 has a circular column shape. On an upper part of the circular column, a protrusion 1161 is provided. The protrusion 1161 is a member that is fitted to the recess 52a formed at an inner side of the top terminal mounting member 52 described above. The top terminal 116 may be formed from, for example, gold-plate processed, oxygen-free copper.

The additional element 112 may be a passive element or an active element. The additional element 112 may be formed from a plurality of elements. As an example, the additional element 112 is a single entity of a capacitor (for example, a high voltage endurance ceramic capacitor), a single entity of an inductor such as a coil, or a circuit in which the capacitors and inductors are connected in parallel or in series. As another example, the additional element 112 may be an active element such as a varactor diode (variable capacity diode). In the example configuration shown in FIG. 2A, the additional element 112 is a capacitor, and is a two-terminal circuit. As an example, the capacitance of the capacity is a fixed value. Alternatively, a variable capacitor may be used as the capacitor. An upper terminal of the additional element 112 is electrically connected to the top terminal 116, and a lower terminal of the additional element 112 is electrically connected to the bottom terminal 118.

The holding structure 114 is a member that fixes the top terminal 116 and the bottom terminal 118 and mechanically connects therebetween. The holding structure 114 is formed from an insulating structure. For the holding structure 114, for example, there is preferably used a material having a relatively small dielectric constant and dielectric loss, and a small vacuum discharge gas velocity. For the holding structure 114, as an example, Teflon (registered trademark) is used.

The bottom terminal 118 has a circular column shape, and is a member that is fitted to the leaf spring 56a of the bottom terminal mounting member 56 described above. At a lower part of the bottom terminal 118, a recess 1181 is formed. A thread groove is formed on an inner surface of the recess 1181. A projection 1321 of a hook 132 to be described later is attached to or detached from the recess 1181. The bottom terminal 118 may be formed from, for example, gold-plate processed, oxygen-free copper.

The transporting container 120 has a tubular shape. On an upper tube 122 of the transporting container 120, the additional member 110 is stored. An inner size of the upper tube 122 corresponds to the outer size of the additional member 110. On an inner surface of a lower tube 124 of the transporting container 120, an O-ring seal 126 is provided. The stick 130 is inserted into the lower tube 124, and airtightness is secured by the O-ring seal 126. The stick 130 is provided through the lower tube 124. An outer size of the transporting container 120 is slightly smaller than the hole size of the through hole of the lower cylinder 92. With such a configuration, the transporting container 120 may be inserted into the through hole of the lower cylinder 92. In addition, an outer size of the transporting container 120 is larger than the size of the through hole of the gate valve housing 76. With such a configuration, the transporting container 120 cannot pass the gate valve housing 76.

The stick 130 is a composite member formed from the hook 132 and a rod 134. The stick 130 is a member which is detachable by screwing with respect to the recess 1181 of the bottom terminal 118. By the stick 130 being inserted into the lower tube 124, the additional member 110 can be moved in an airtight manner.

The hook 132 has the projection 1321 at an upper end, a disk section 1322 at an intermediate position, and a circular column member 1323 at a lower end. On a side surface of the projection 1321, a thread groove is formed. The hook 132 is fixed to the rod 134 at its lower end by adhesion. A size of the thread groove of the projection 1321 is adapted to the size of the thread groove of the recess 1181 of the bottom terminal 118. An outer size of the intermediate disk section 1322 corresponds to an inner size of the upper tube 122 of the transporting container 120. The hook 132 is formed from, for example, brass.

The rod 134 is a round bar having a relatively long length. The rod 134 is fixed at its upper end to the lower end of the hook 132 by adhesion. The rod 134 is preferably formed from, for example, FRP, which is a material having a low thermal conductivity, in order to inhibit flow-in heat.

FIG. 2B shows a state in which the additional member 110, the transporting container 120, and the stick 130 are assembled. Hereinafter, the member in which the additional member 110, the transporting container 120, and the stick 130 are integrated will be referred to as an "additional member transport unit 140." The rod 134 of the stick 130 is inserted into the upper tube 122 of the transporting container 120, extends through the lower tube 124, and is attached to the transporting container 120. The additional member 110 is then stored in the upper tube 122 of the transporting container 120, and the projection 1321 of the hook 132, is fitted by screwing to the recess 1181 of the bottom terminal 118. With this process, the stick 130 is attached to the additional member 110.

Next, with reference to FIGS. 1 and 3-12, a procedure for mounting the additional member 110 to the NMR probe will be described. Although FIGS. 3-12 do not show the static magnetic field generation apparatus 150 and the bore 152, during the process, the insertion section 10 is inserted into the bore 152.

FIG. 1 shows a state of an initial stage. The initial stage state is a state before the additional member 110 is inserted into the NMR probe. In this state, the gate 72 is inserted into the deepest position. In other words, the gate 72 is closed.

With such a configuration, the sub airtight chamber is separated into the upper airtight chamber 102 and the lower airtight chamber 104. In addition, the insertion hole plug 94 is inserted into the through hole of the lower cylinder 92. With this configuration, the airtightness of this portion is secured, and the lower airtight chamber 104 is separated from the atmospheric space. In addition, the primary valve 24 is opened. With this process, the primary airtight chamber 100 is opened to the vacuum pump, and a pressure of the primary airtight chamber 110 is reduced by the vacuum pump. In addition, the upper valve 68 is opened. With this process, the upper airtight chamber 102 is opened to the vacuum pump, and a pressure of the upper airtight chamber 102 is reduced by the vacuum pump. Moreover, the lower valve 82 is opened. With this process, the lower airtight chamber 104 is opened to the vacuum pump, and a pressure of the lower airtight chamber 104 is reduced by the vacuum pump. For example, the valves are opened in the order of the primary valve 24, the upper valve 68, and the lower valve 82. The airtight chambers are sealed by the O-ring seals with respect to the atmosphere, and the pressures are successively reduced by the vacuum pump. For example, the degree of vacuum in each airtight chamber is maintained at less than or equal to $1 \times 10^{-3}$ Pa. The degree of vacuum corresponds to, for example, a degree of vacuum in which electrical discharge does not occur at room temperature. In this state, the insertion section 10 is mounted in the bore 152 of the static magnetic field generation apparatus 150. In addition, in low-temperature operation, the members to be cooled are cooled to, for example, a temperature of less than or equal to 20K.

Figure 3:
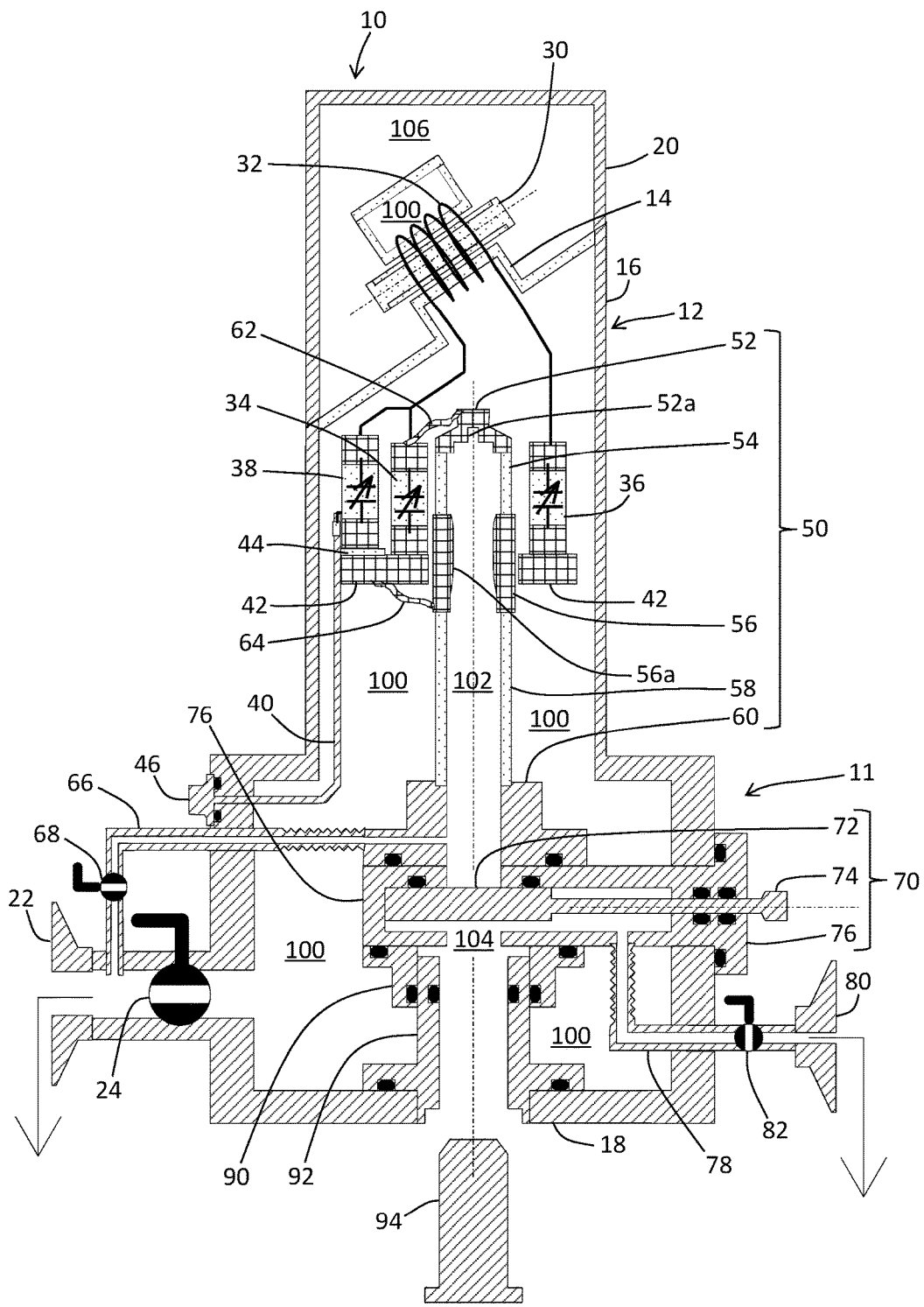
FIG. 3 is a cross sectional diagram of the NMR probe according to the first preferred embodiment of the present invention.

FIG. 3 shows a state of a second stage. In this stage, the primary valve 24 is in the open state, and thus, a pressure of the primary airtight chamber 100 is reduced by the vacuum pump. In addition, the gate 72 is in the closed state, and this state is maintained. With this configuration, the upper airtight chamber 102 is disconnected from the lower airtight chamber 104. The upper valve 68 and the lower valve 82 are closed. With this process, the primary airtight chamber 100 and the upper airtight chamber 102 are disconnected from each other. As will be described later, the additional member 110 is to be inserted into the upper airtight chamber 102. With this insertion, even if the degree of vacuum of the upper airtight chamber 102 is reduced, because the primary airtight chamber 100 and the upper airtight chamber 102 are disconnected from each other, the degree of vacuum of the primary airtight chamber 100 (degree of vacuum of the space in which the tank circuit is placed) is maintained. In addition, the lower airtight chamber 104 is disconnected from the vacuum pump. In this state, the operator pulls out the insertion hole plug 94 from the through hole of the lower cylinder 92. With this process, the lower airtight chamber 104 is opened to the atmospheric space, and the pressure of the lower airtight chamber 104 becomes equal to the atmospheric pressure.

Figure 4:
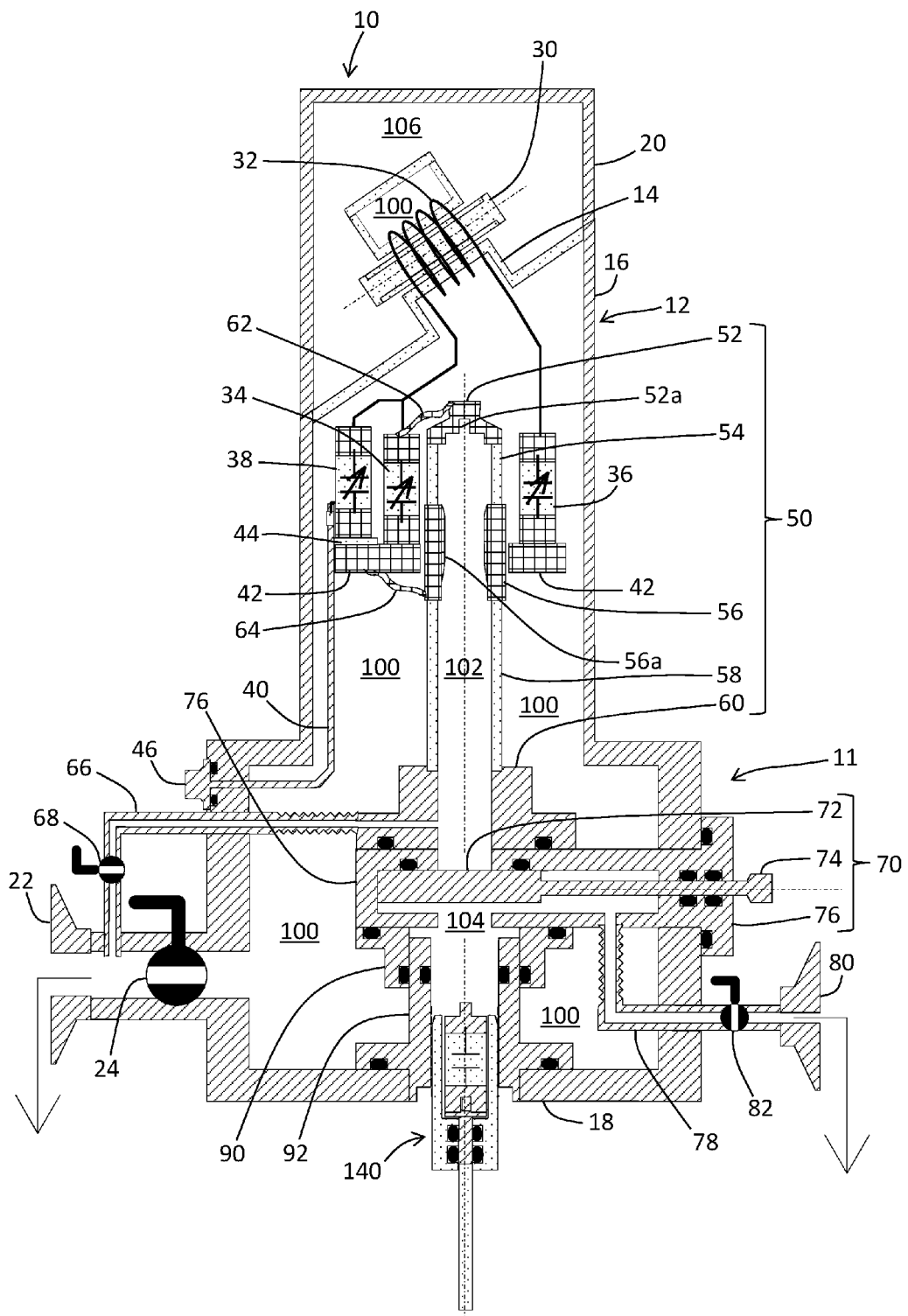
FIG. 4 is a cross sectional diagram of the NMR probe according to the first preferred embodiment of the present invention.

FIG. 4 shows a state of a third stage. In this stage, the primary valve 24 is in the open state, and thus, a pressure of the primary airtight chamber 100 is reduced by the vacuum pump. The gate 72 is in the closed state and this state is maintained. With this configuration, the upper airtight chamber 102 is disconnected from the atmospheric space. In addition, the upper valve 68 and the lower valve 82 are in the closed state, and this state is maintained. In this state, the operator inserts the additional member transport unit 140 into the through hole of the lower cylinder 92. The hole size of the through hole of the lower cylinder 92 is slightly larger than the outer size of the transporting container 120. When the transporting container 120 is inserted into the through hole of the lower cylinder 92, the inner circumferential surface of the lower cylinder 92 is airtightly connected to the outer circumferential surface of the transporting container 120 via the O-ring seal. With this configuration, the airtightness of this portion is secured.

Figure 5:
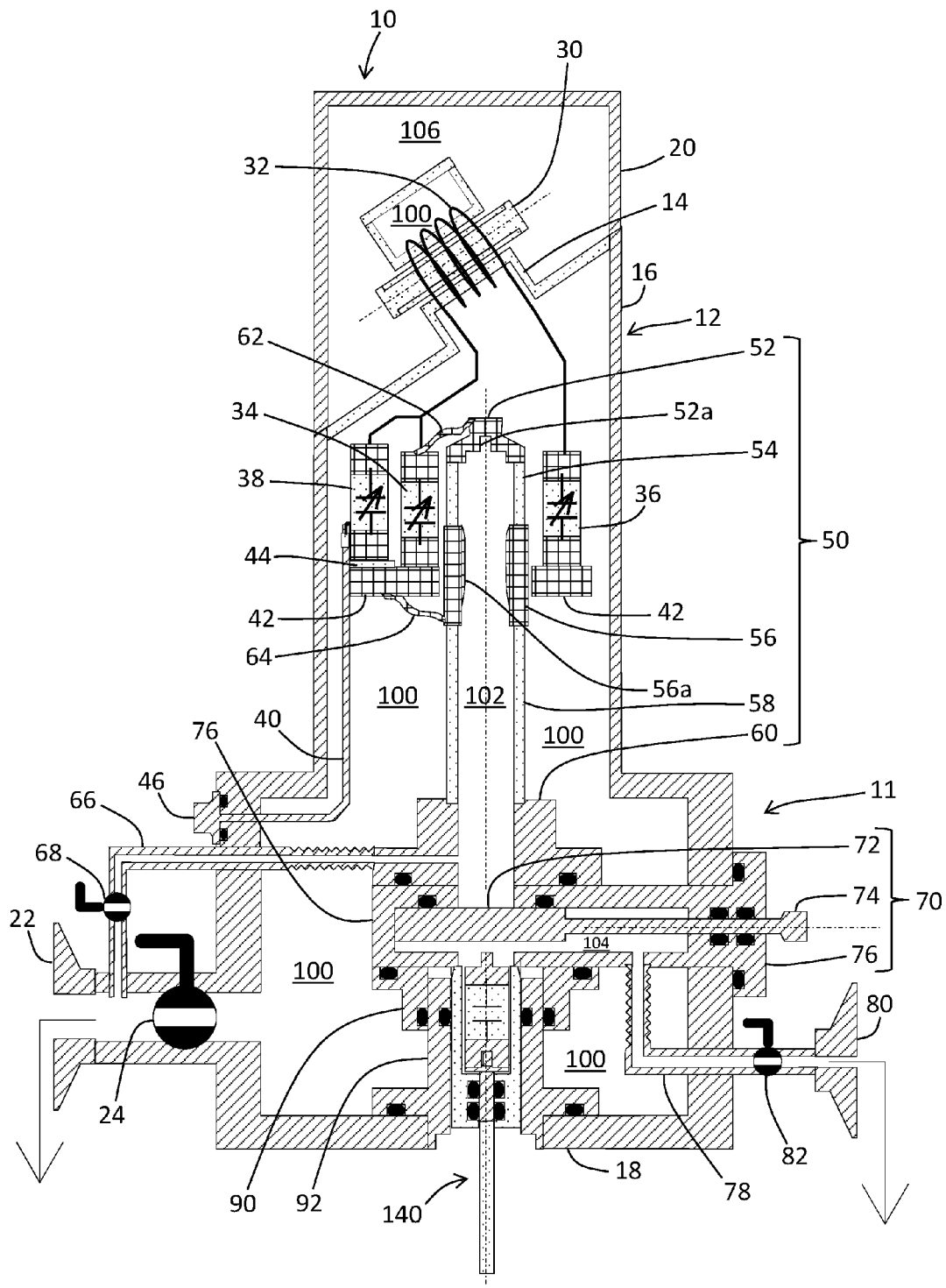
FIG. 5 is a cross sectional diagram of the NMR probe according to the first preferred embodiment of the present invention.

Next, as shown in FIG. 5, the operator presses the additional member transport unit 140 until the tip of the transporting container 120 contacts the gate valve housing 76. In the present preferred embodiment, the hole size of the through hole formed on the lower surface of the gate valve housing 76 is smaller than the outer size of the transporting container 120 and is larger than the outer size of the additional member 110. With such a configuration, when the additional member transport unit 140 is pressed in, the tip of the transporting container 120 contacts the gate valve housing 76, and the transporting container 120 remains at this position without passing through the gate valve housing 76. In this process, the outer circumferential surface of the transporting container 120 and the inner circumferential surface of the lower cylinder 92 are airtightly connected to each other via the O-ring seal, and the airtightness of this portion is thus maintained. In addition, the tip of the transporting container 120 is in contact with the gate valve housing 76, and the airtightness of this portion is thus maintained. In this manner, the transporting container 120 functions as a plug for maintaining the vacuum. Thus, the lower airtight chamber 104 is separated from the atmospheric space. In this stage, the primary valve 24 is in the open state, the upper valve 68 and the lower valve 82 are in the closed state, and the gate 72 is in the closed state. After the additional member transport unit 140 is pressed in until the tip of the transporting container 120 contacts the gate valve housing 76, the lower valve 82 is opened. With this process, the lower airtight chamber 104 is opened to the vacuum pump. As the transporting container 120 functions as the plug for maintaining vacuum, the lower airtight chamber 104 is disconnected from the atmospheric space. A pressure of the lower airtight chamber 104 is reduced by the vacuum pump. For example, the operator waits until the degree of vacuum of the lower airtight chamber 104 is reduced to $1 \times 10^{-3}$ Pa or less. Because the pressure of the lower airtight chamber 104 is reduced by the vacuum pump, the transporting container 120 is suctioned upward, and the position is maintained. With this process, falling of the additional member transport unit 140 is prevented. Alternatively, the operator may press the rod 134 upward. Alternatively, the upper valve 68 may be opened so that the pressure of the upper airtight chamber 102 is reduced by the vacuum pump. The state shown in FIG. 5 is a state of a fourth stage.

Figure 6:
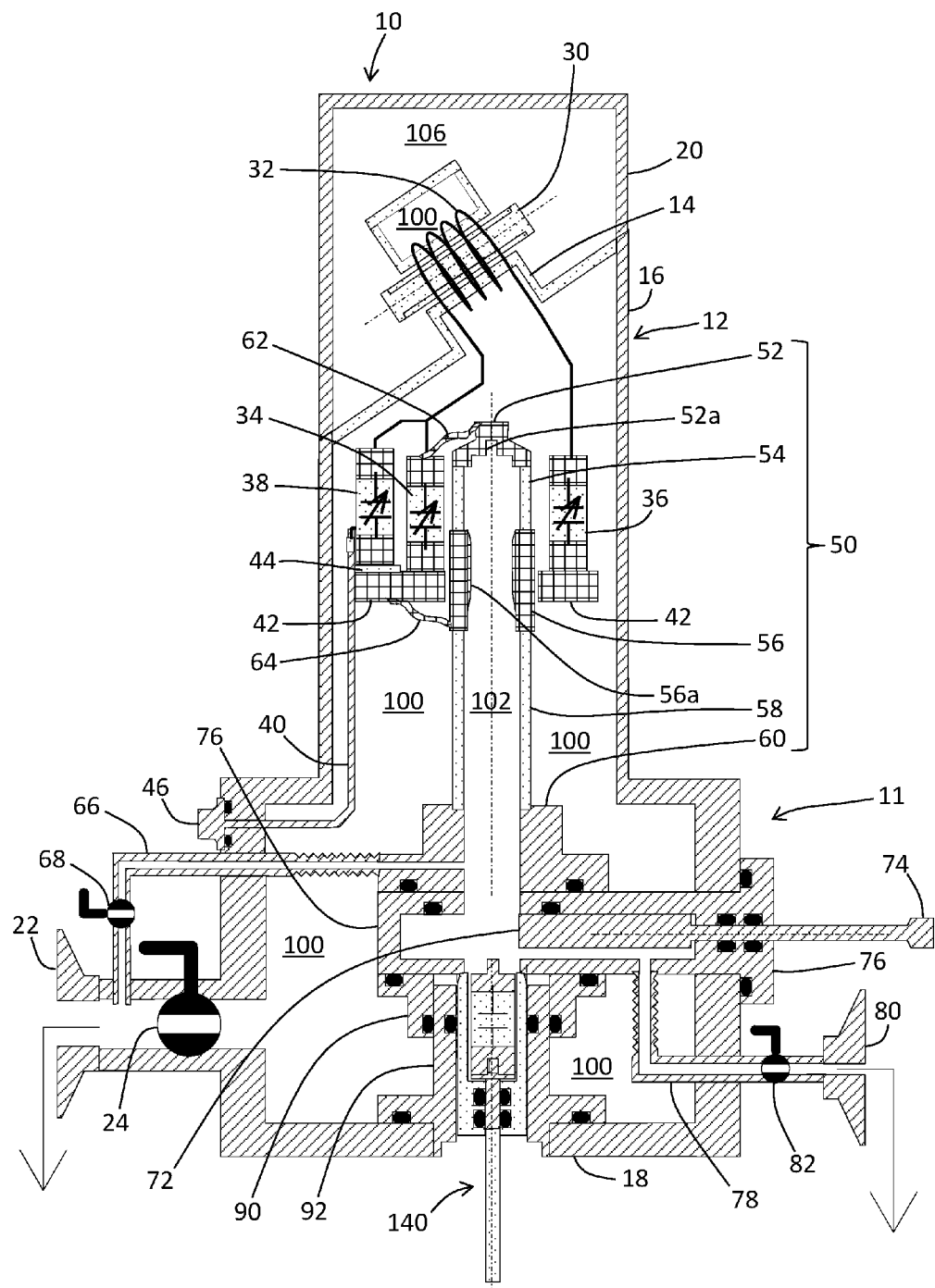
FIG. 6 is a cross sectional diagram showing the NMR probe according to the first preferred embodiment of the present invention.

FIG. 6 shows a state of the fifth stage. In this stage, the primary valve 24 is in the open state, and the pressure of the primary airtight chamber 100 is thus reduced by the vacuum pump. In addition, the upper valve 68 is in the closed state, and this state is maintained. Further, the position of the transporting container 120 is maintained, and the transporting container 120 functions as a plug for maintaining vacuum. Moreover, the lower valve 82 is in the open state, and the pressure of the lower airtight chamber 104 is thus reduced by the vacuum pump. In this state, the operator opens the gate 72. With this process, the upper airtight chamber 102 and the lower airtight chamber 104 are connected to each other, and the pressures of the upper airtight chamber 102 and the lower airtight chamber 104 are reduced by the vacuum pump through the lower aeration tube 78. Because the transporting container 120 functions as the plug for maintaining vacuum, even when the gate 72 is opened, the sub airtight chambers (the upper airtight chamber 102 and the lower airtight chamber 104) are disconnected from the atmosphere.

Figure 7:
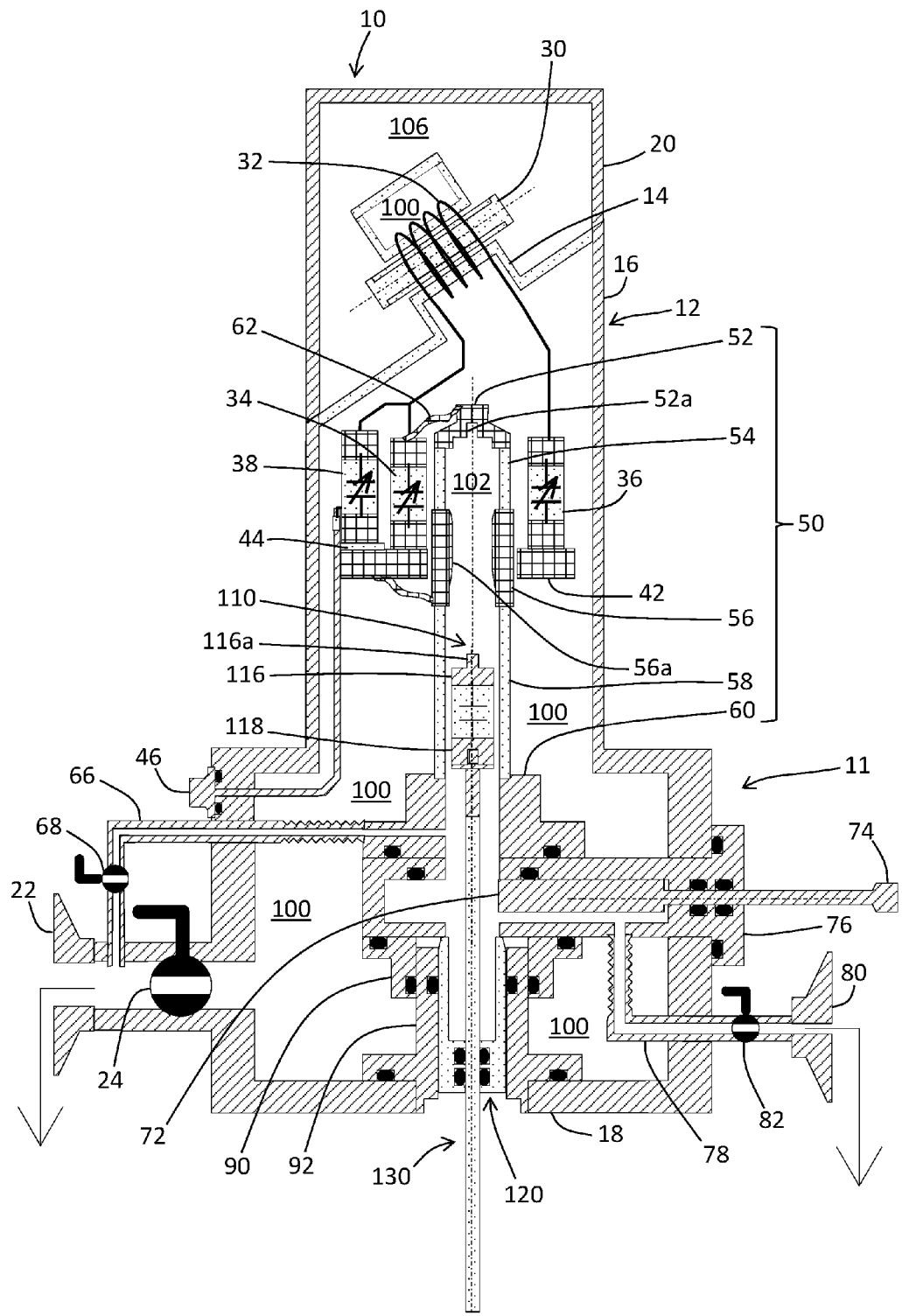
FIG. 7 is a cross sectional diagram of the NMR probe according to the first preferred embodiment of the present invention.

FIG. 7 shows a state of a sixth stage. In this stage, the operator presses the stick 130 upward. The hole sizes of the through holes formed on the lower surface and the upper surface of the gate valve housing 76 are larger than the outer size of the additional member 110. Therefore, when the stick 130 is pressed upward, the additional member 110 passes through the gate valve housing 76 and is inserted into the upper airtight chamber 102. Because the outer size of the transporting container 120 is larger than the hole size of the through hole formed on the lower surface of the gate valve housing 76, the transporting container 120 remains within the through hole of the lower cylinder 92.

Figure 8:
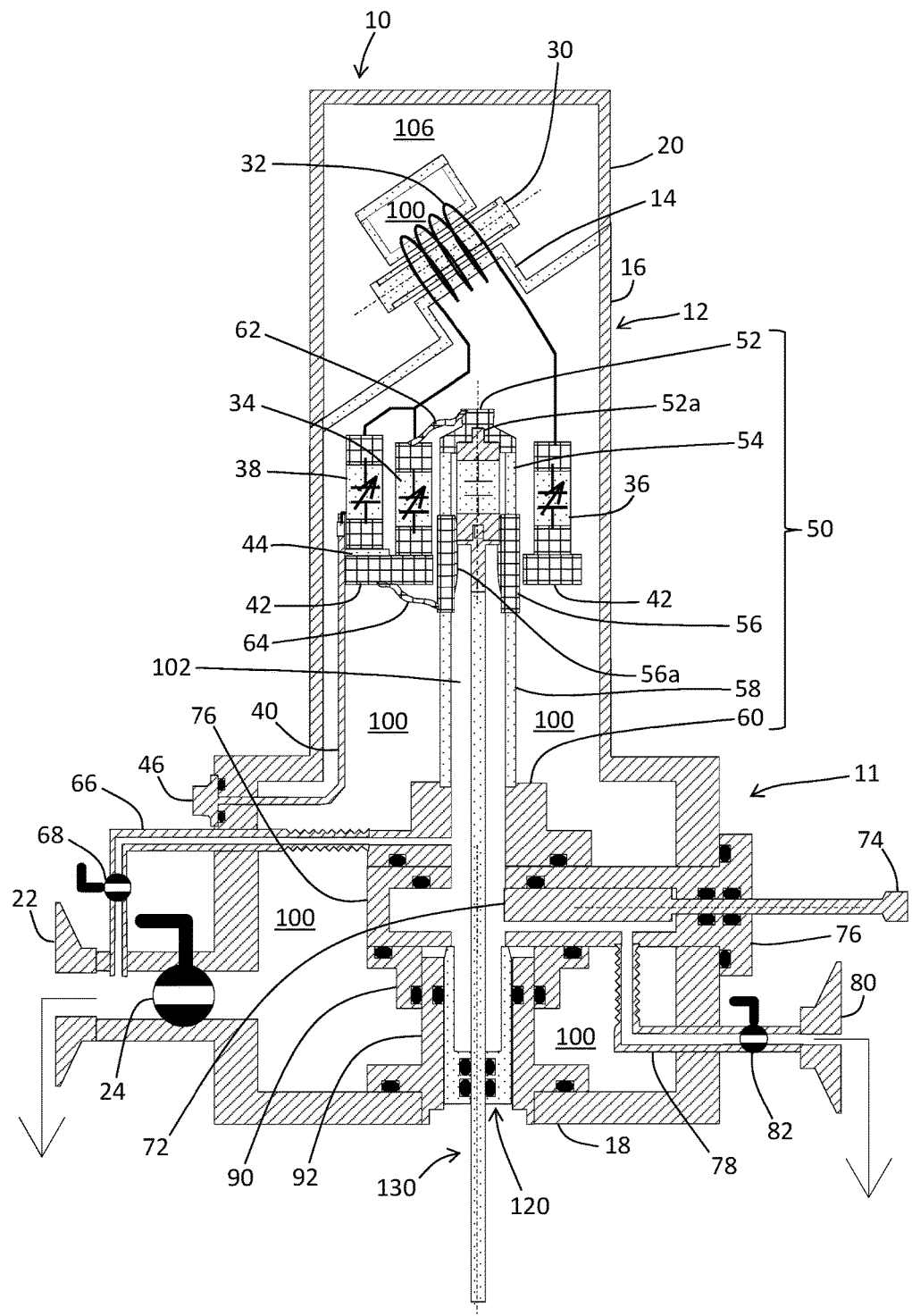
FIG. 8 is a cross sectional diagram of the NMR probe according to the first preferred embodiment of the present invention.

Then, as shown in FIG. 8, the operator presses the stick 130 until the protrusion 1161 of the top terminal 116 of the additional member 110 is fitted to the recess 52a of the top terminal mounting member 52, and the bottom terminal 118 is fitted to the leaf spring 56a of the bottom terminal mounting member 56. With this process, the additional member 110 is mounted in the NMR probe, and the additional element 112 is added to the tank circuit. When the additional member 110 is set on the top terminal mounting member 52 and the bottom terminal mounting member 56, at the same time, the top terminal 116 and the top terminal mounting member 52 are electrically connected to each other, and the bottom terminal 118 and the bottom terminal mounting member 56 are electrically connected to each other. With such a process, the additional element 112 included in the additional member 110 is electrically connected to the tank circuit. With this addition, the tuning range of the tank circuit is changed. In this stage, the primary valve 24 is in the open state, and the pressure of the primary airtight chamber 100 is thus reduced by the vacuum pump. In addition, the upper valve 68 is in the closed state, and this state is maintained. Further, the position of the transporting container 120 is maintained, and the transporting container 120 functions as a plug for maintaining vacuum. Moreover, the lower valve is in the open state, and the pressures of the upper airtight chamber 102 and the lower airtight chamber 104 are reduced by the vacuum pump through the lower aeration tube 78. This state is a state of a seventh stage. When the additional element 112 is added to the tank circuit, the impedance of the tank circuit changes. Therefore, the impedance of the tank circuit may be measured, to detect mounting of the additional member 110 based on the measurement result.

Figure 9:
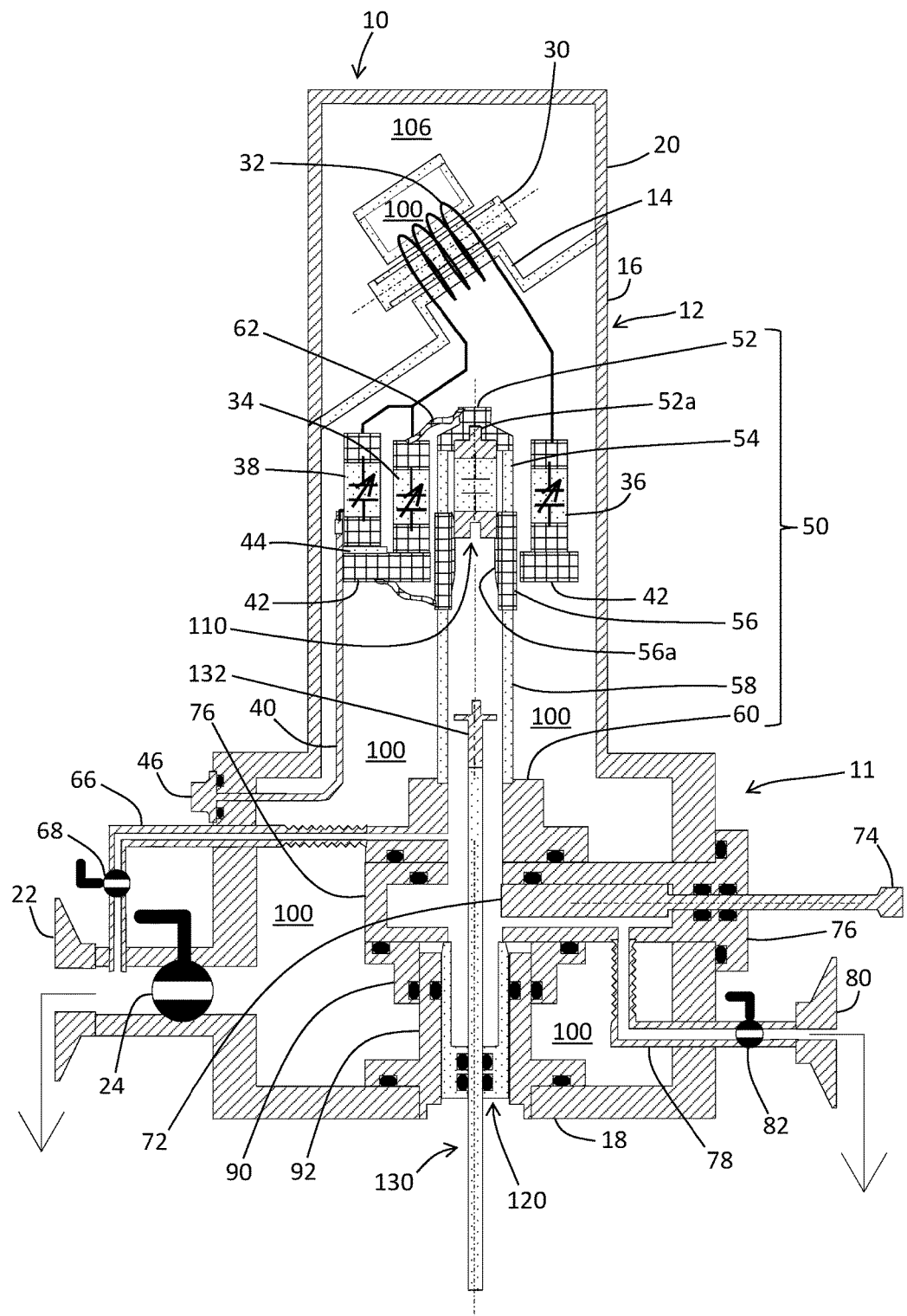
FIG. 9 is a cross sectional diagram of the NMR probe according to the first preferred embodiment of the present invention.

FIG. 9 shows a state of an eighth stage. As described above, the hook 132 is fitted to the bottom terminal 118 of the additional member 110 by screwing. Therefore, when the operator rotates the stick 130, the stick 130 is detached from the additional member 110. The additional member 110 is fitted by the top terminal mounting member 52 and the bottom terminal mounting member 56, and the fitting functions as a stopper of rotation of the additional member 110. The stick 130 is pulled downward until the hook 132 is positioned in the lower airtight chamber 104. In this stage, the primary valve 24 and the lower valve 82 are in the open state. In addition, the upper valve 68 is in the closed state.

Figure 10:
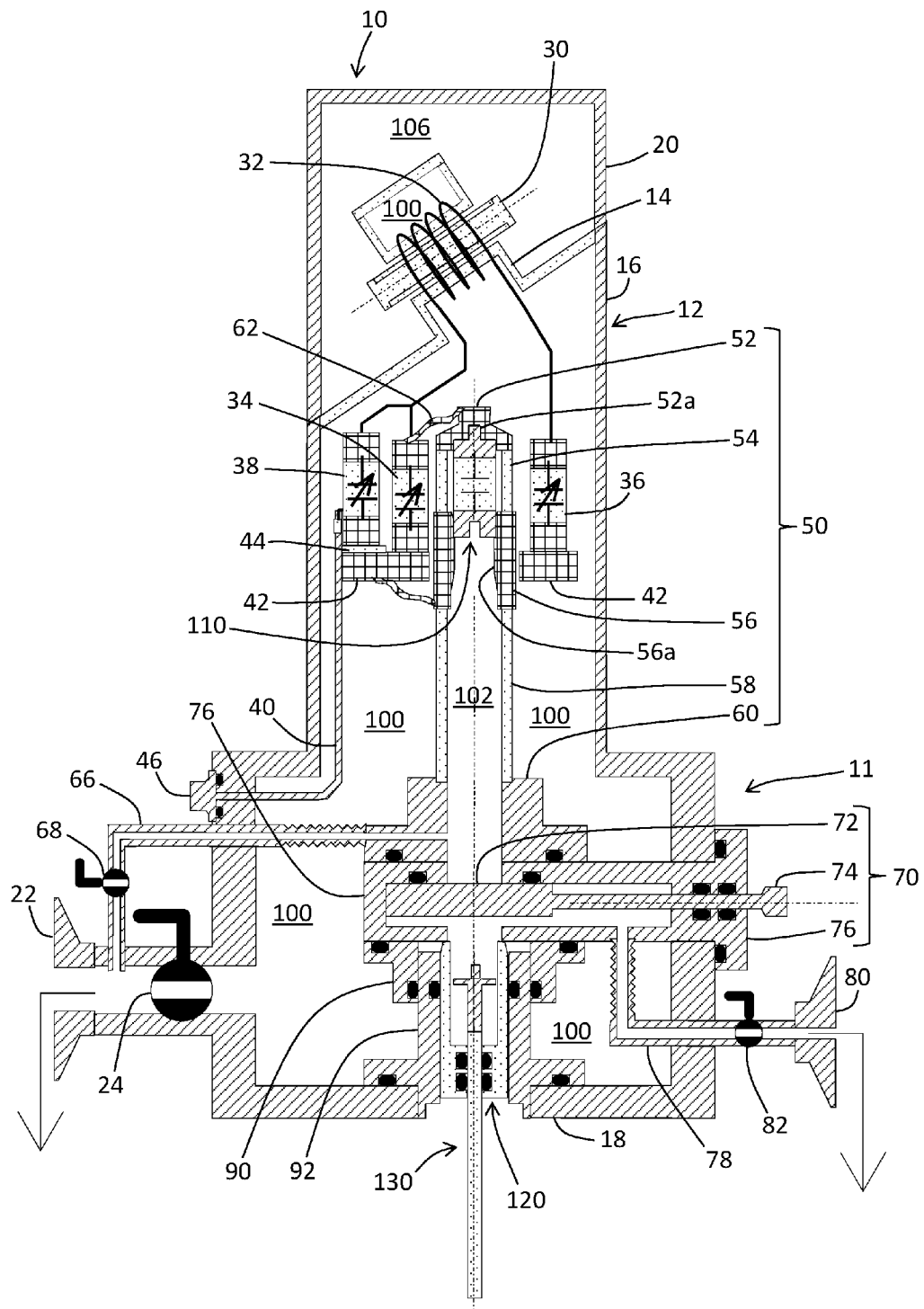
FIG. 10 is a cross sectional diagram of the NMR probe according to the first preferred embodiment of the present invention.

FIG. 10 shows a state of a ninth stage. In this stage, the operator pulls the stick 130 downward until the hook 132 is stored in the upper tube 122 of the transporting container 120. Then, the gate 72 is closed. With this process, the upper airtight chamber 102 and the lower airtight chamber 104 are separated from each other. In this stage, the primary valve 24 and the lower valve 82 are in the open state, and the upper valve 68 is in the closed state.

Figure 11:
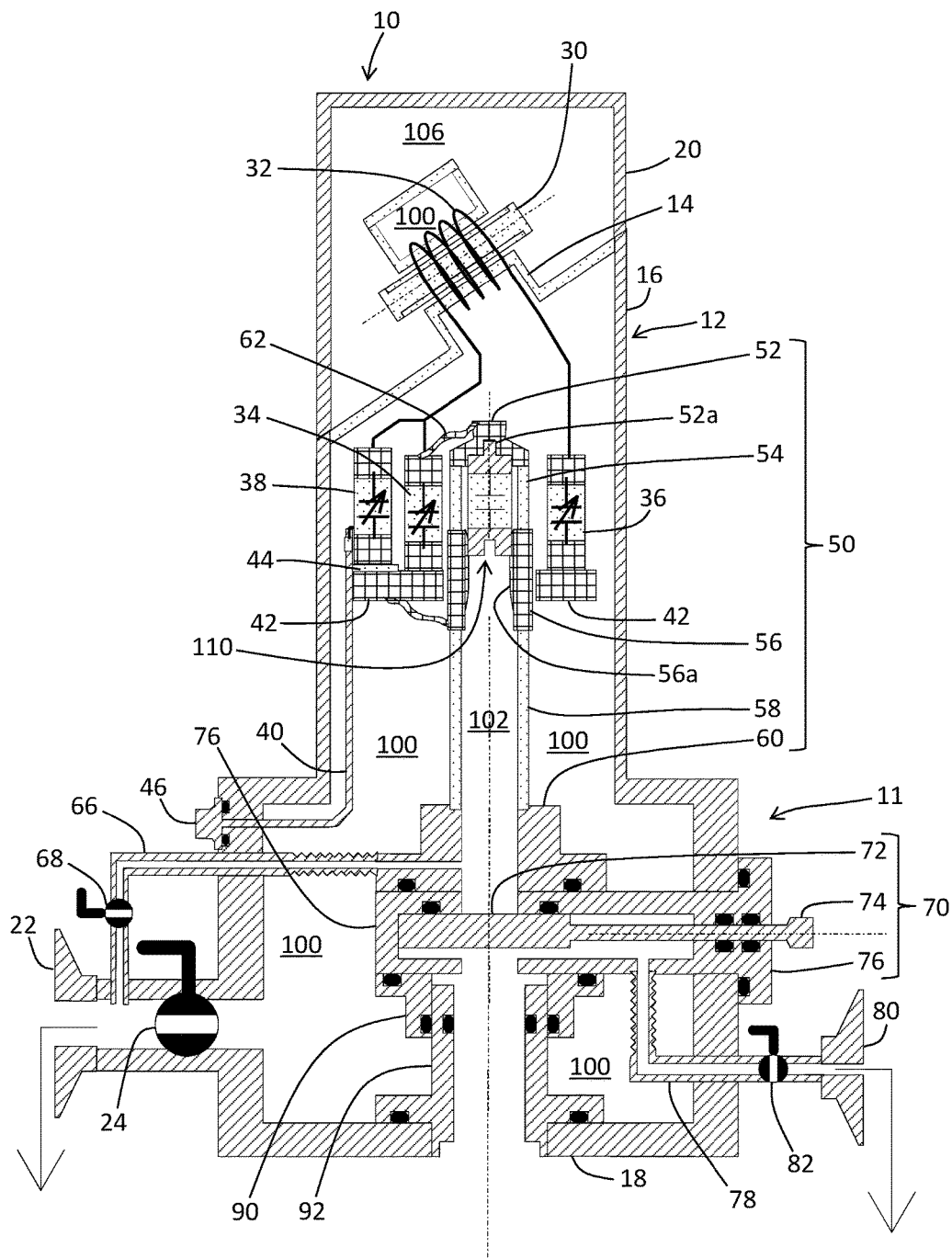
FIG. 11 is a cross sectional diagram of the NMR probe according to the first preferred embodiment of the present invention.

FIG. 11 shows a state of a tenth stage. In this stage, first, the lower valve 82 is closed. With this process, the lower airtight chamber 104 is disconnected from the vacuum pump. The transporting container 120 is pulled out of the through hole of the lower cylinder 92 along with the stick 130. With this process, the lower airtight chamber 104 is opened to the atmospheric space, and the pressure in the lower airtight chamber 104 becomes equal to the atmospheric pressure. Because the gate 72 is in the closed state, the upper airtight chamber 102 is disconnected from the atmospheric space.

Figure 12:
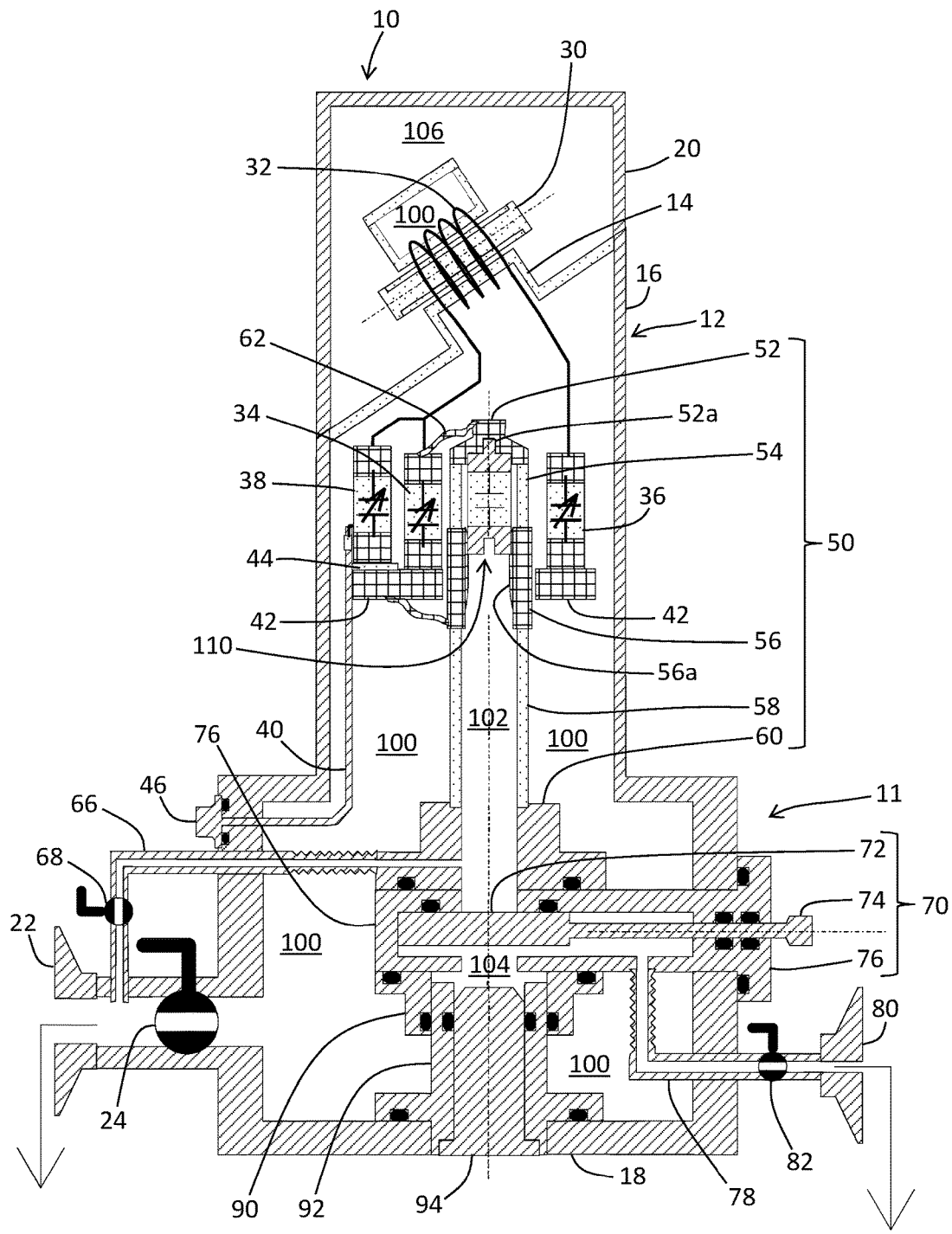
FIG. 12 is a cross sectional diagram of the NMR probe according to the first preferred embodiment of the present invention.

FIG. 12 shows a state of an eleventh stage. In this stage, the operator inserts the insertion hole plug 94 into the through hole of the lower cylinder 92. With this process, the lower airtight chamber 104 is disconnected from the atmospheric space. Then, the lower valve 82 is opened. With this process, the lower airtight chamber 104 is opened to the vacuum pump, and the pressure of the lower airtight chamber 104 is reduced. The upper valve 68 is opened, and the upper airtight chamber 102 is thus opened to the vacuum pump.

When the additional member 110 is to be exchanged, the transporting container 120 in which the additional member 110 is not stored is placed in the through hole of the lower cylinder 92 according to the above-described procedure, and, in this state, the stick 130 is inserted into the upper airtight chamber 102. The additional member 110 is then attached to the hook 132 of the stick 130, and the stick 130 is pulled downward while maintaining this state. With this process, the additional member 110 is detached from the top terminal mounting member 52 and the bottom terminal mounting member 56. At the same time, the additional element 112 and the tank circuit are electrically disconnected from each other. Then, the additional member 110 is stored in the transporting container 120, and the additional member 110, the transporting container 120, and the stick 130 are pulled out. With this process, the additional member 110 is removed from the NMR probe. Another additional member 110 is then mounted in the NMR probe according to the above-described procedure. During this operation, the degrees of vacuum in the primary airtight chamber 100 and the upper airtight chamber 102 are maintained.

As described, during the low-temperature operation, the additional element 112 can be added to the tank circuit or the additional element 112 can be removed from the tank circuit in a state where the insertion section 10 is inserted into the bore 152 of the static magnetic field generation apparatus 150 and in a state where the degrees of vacuum of the primary airtight chamber 100 and the upper airtight chamber 102 are maintained. With this configuration, it becomes possible to change the tuning range of the tank circuit while maintaining the above-described environment.

If, in order to change the tuning range according to the nuclear species to be measured, the NMR probe is to be detached from the static magnetic field generation apparatus 150 and is to be then re-attached to the static magnetic field generation apparatus 150 after the tuning range is changed, the following disadvantage may be caused. Specifically, during the detachment and re-attachment, a mechanical error (error in the position, inclination, and the like of the NMR probe) may occur, and, due to the mechanical error, the measurement condition which is precisely set (such as the magic angle and uniformity of the static magnetic field) may be lost. This is not desirable not only from the viewpoint of the convenience, but also from the viewpoint of reproducibility of the NMR measurement.

In consideration of this, in the present preferred embodiment, a valve, a lever, or the like are placed in a lower housing of the NMR probe so that the operator can access the apparatus from the outside when the insertion section 10 is mounted in the bore 152 of the static magnetic field generation apparatus 150. With such a configuration, it becomes possible to operate on the valve, the lever, or the like in order to add or exchange the additional member 110 while the insertion section 10 is maintained in the mounted state in the bore 152 of the static magnetic field generation apparatus 150.

When the additional member 110 is added or the like in the low-temperature operation state, if the atmospheric air flows into the primary airtight chamber 100 and the upper airtight chamber 102, and the degree of vacuum is worsened, nitrogen, oxygen, moisture, or the like of the atmospheric air would condensate on the members to be cooled. For example, when the degree of vacuum is worsened from $10^{-3}$ Pa, such a phenomenon may occur. Because the flow-in of heat from the member under the room temperature would be increased by the thermal conduction of the gas, the temperature of the metal conductor included in the members to be cooled would be increased. In addition, a discharge start voltage on the surface of the electrode would be reduced. Moreover, because the oxygen molecule is a paramagnetic substance, the uniformity of the static magnetic field would be reduced, and the resolution of the NMR signal would be consequently reduced. Thus, various disadvantages arise, and the circuit capability necessary for the solid NMR measurement cannot be maintained in the tank circuit. These disadvantages will be described below in more detail.

First, when the atmospheric air flows into the primary airtight chamber 100 in the low-temperature operation state, a vacuum heat insulation is lost. Then, due to the thermal conduction of the gas, heat flows from the members at room temperature into the members to be cooled of the tank circuit, and the temperature of the members to be cooled is increased. With such a process, a high-sensitivity signal detection characteristic of the detection circuit is degraded. In order to handle this disadvantage, there may be employed a configuration in which the adding operation of the additional member 110 is completed within a short period of time, and the degree of vacuum of the primary airtight chamber 100 is returned to the original degree of vacuum.

However, when the atmospheric air flows into the tank circuit during the cooling operation, the following disadvantage may arise. Specifically, due to the flow-in and condensation of molecular oxygen, an NMR spectrum resolution may be reduced. The temperature of the transmission and reception coil of the detection system cool-type NMR probe is set to less than or equal to 20K using, for example, a cryostat cooling system. On the other hand, the melting point of oxygen molecule is about 55K. Therefore, the molecular oxygen flowing into the primary airtight chamber 100 is adhered to the surfaces of the members to be cooled including the transmission and reception coil 32, and is condensed. The molecular oxygen has a paramagnetic characteristic. Because of this, the molecular oxygen adhered to the member to be cooled disturbs the uniformity of the magnetic field in the sample space placed at the center of the transmission and reception coil 32, and significantly reduces the resolution of the NMR spectrum to be observed.

As another disadvantage, the discharge start voltage may be reduced. In the NMR probe, in order to prevent electrical discharge when the high-frequency pulse of an electric power of a few tens to a few hundreds of W is irradiated, a sufficient degree of vacuum (for example, first half of 10⁻⁴ Pa at room temperature) must be realized by the pressure-reduction process by the vacuum pump (for example, turbo molecular pump), to remove the gas molecules adhered to the periphery of the circuit element. If the atmospheric air flows in at the low temperature, the gas molecule would adhere and condense on the surface of components of the high-frequency circuit, and formation of plasma of the adhered gas molecule would be easily caused in particular by charge discharge at the connection point between the electrode and the dielectric. With this phenomenon, the discharge start voltage may be reduced, and a disadvantage may arise in which, because discharge is caused, a high-frequency magnetic field of a desired intensity cannot be irradiated onto the sample, which would consequently make it impossible to obtain quantitativity and reproducibility of the spectrum.

In the present preferred embodiment, in the low-temperature operation, the additional member 110 can be added or the like without affecting the degrees of vacuum of the primary airtight chamber 100 and the upper airtight chamber 102. With such a configuration, it becomes possible to change the tuning range of the tank circuit without causing the above-described disadvantages.

Figure 13A:
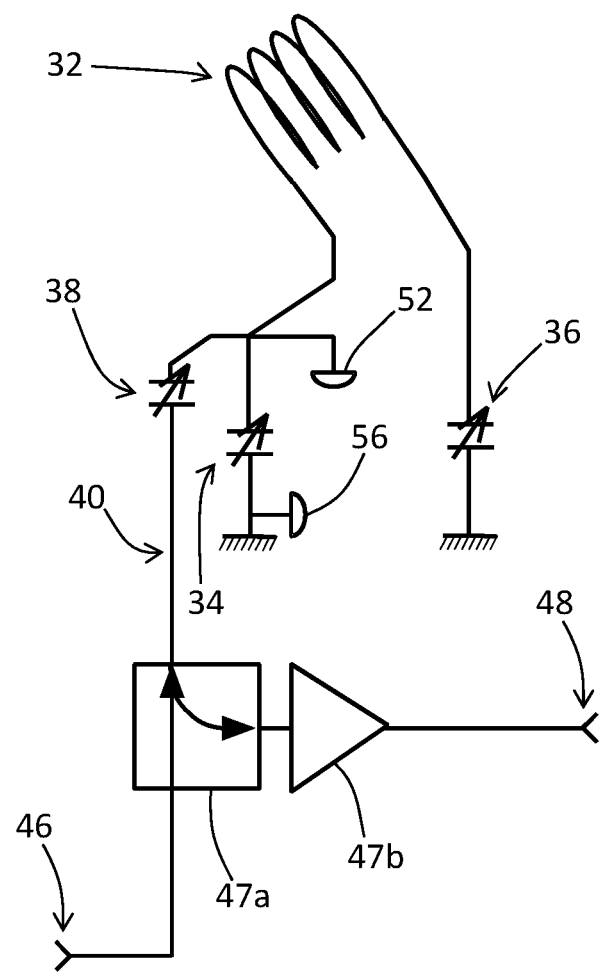
FIG. 13A is an electrical circuit diagram of a tank circuit according to the first preferred embodiment of the present invention.
Figure 13B:
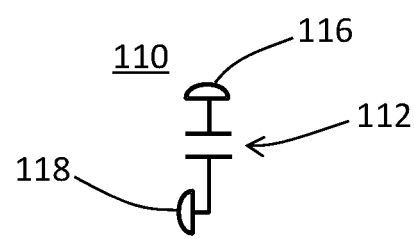
FIG. 13B is an electrical circuit diagram of the tank circuit according to the first preferred embodiment of the present invention.
Figure 13C:
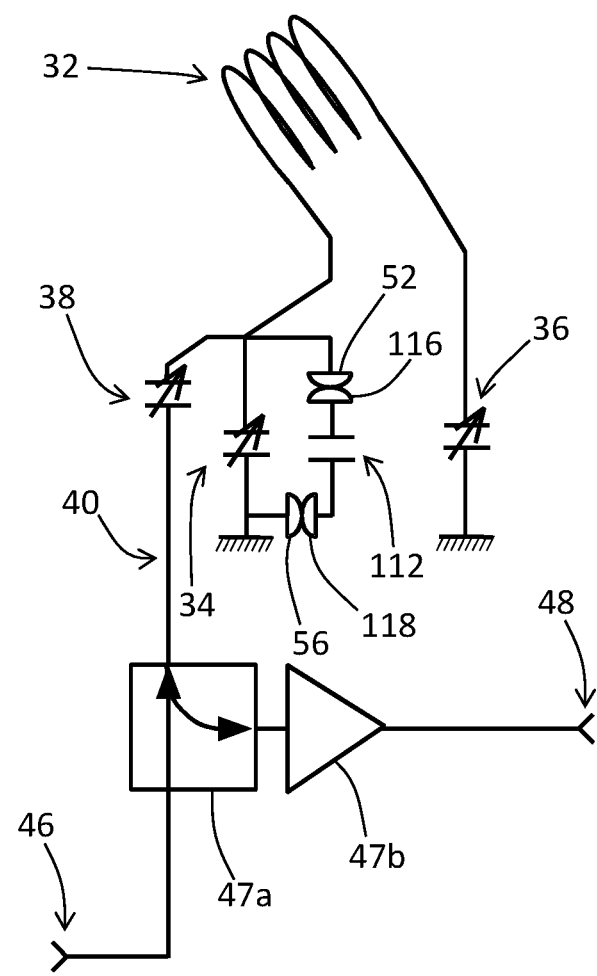
FIG. 13C is an electrical circuit diagram of the tank circuit according to the first preferred embodiment of the present invention.

Next, the tank circuit (detection circuit) in the first preferred embodiment will be described with reference to FIGS. 13A, 13B, and 13C. FIGS. 13A, 13B, and 13C are electrical circuit diagrams.

FIG. 13A shows the tank circuit in a state where the additional member 110 is not added. The transmission path 40 is electrically connected via circuit elements (a duplexer 47a and a pre-amplifier 47b) to a transmission port 46 or a reception port 48. With such a configuration, transmission of radio wave and reception of the NMR signal are executed between the NMR probe and an NMR spectrometer placed outside of the NMR probe. The duplexer 47a is a transmission/reception switching circuit connected to the transmission port 46, the tank circuit, and the pre-amplifier 47b. The duplexer 47a has a function to efficiently transmit a radio wave pulse which is input from the transmission port 46 to the tank circuit during transmission. The duplexer 47a also has a function to efficiently transmit the NMR signal detected by the transmission and reception coil 32 from the tank circuit to the pre-amplifier 47b during reception of the NMR signal. The NMR signal is amplified by the pre-amplifier 47b, is transmitted to a receiver of the spectrometer from the reception port, and is taken in as numerical data by A/D conversion.

In order to tune and match, a directional coupler (not shown) is provided. With the directional coupler, a reflected wave returning from the tank circuit to the transmission side is observed. A level of the reflected wave is a value indicating the tuning state and the matching state of the tank circuit. Therefore, by changing the setting values (capacitances) of the variable capacitors included in the tank circuit while referring to the level of the reflected wave, tuning and matching are achieved.

In the tank circuit shown in FIG. 13A, when an inductance of the transmission and reception coil 32 is $L_S$ and the capacitances of the tuning variable capacitor 34, the balancing variable capacitor 36, and the matching variable capacitor 38 are $C_T$, $C_B$, and $C_M$, respectively, a resonance frequency $f_a$ that minimizes the impedance is represented by the following Equation (1).

(Equation 1)

$$f_a = \frac{1}{2\pi \sqrt{L_S \left( \frac{C_T C_B}{C_T + C_B} \right)}} \quad (1)$$

Because the inductance $L_S$ is a fixed value, the range of the frequency that can be tuned is limited by $C_T$ and $C_B$, which are variable values.

FIG. 13B shows a circuit structure of the additional member 110.

FIG. 13C shows a tank circuit in a state where the additional member 110 is added. When the additional member 110 is added to the tank circuit, the top terminal 116 of the additional member 110 is electrically connected to the top terminal mounting member 52, and the bottom terminal 118 is electrically connected to the bottom terminal mounting member 56. With this process, the additional element 112 (capacitor) is added in parallel to the tuning variable capacitor 34. When the capacitance of the additional element 112 is $C_X$, the resonance frequency $f_b$ that minimizes the impedance in this tank circuit is represented by the following Equation (2).

(Equation 2)

$$f_b = \frac{1}{2\pi \sqrt{L_S \left\{ \frac{(C_T + C_X)C_B}{C_T + C_X + C_B} \right\}}} \quad (2)$$

Because the inductance $L_S$ is a fixed value, the range of the frequency that can be tuned is limited by $(C_X + C_T)$ and $C_B$, which are variable values. Because an arbitrary fixed value may be assigned to $C_X$ by exchanging the additional element 112, tuning can be achieved for various frequency ranges.

Meanwhile, matching with respect to a characteristic impedance $Z_0$ of the impedance of the tank circuit is adjusted by the matching variable capacitor 38.

According to the present preferred embodiment, by exchanging the additional member 110 according to the nuclear species to be measured, it becomes possible to flexibly change the tuning range. For example, there may be considered a configuration in which a plurality of capacitors are placed in advance in the NMR probe, and the capacitors are exchanged according to the usage. However, in this configuration, only the usages corresponding to the number of capacitors which are placed in advance can be handled. In the present preferred embodiment, the additional member 110 can be exchanged according to the usage, and thus, the tuning range can be changed without such a limitation.

Because the additional member 110 is inserted into the NMR probe, there is a possibility of degradation of the degree of vacuum in the NMR probe. In order to handle this, the following method may be employed. In the atmosphere, moisture is attached on the surface of the additional member 110. In order to remove the moisture, the additional member 110 may be heated with a dryer or the like immediately before the insertion. Alternatively, the additional member 110 and the transporting container 120 may be inserted into the lower airtight chamber, and the pressure of the lower airtight chamber 104 may be reduced to a high vacuum (for example, less than or equal to 10⁻⁴ Pa). After the pressure reduction, in order to remove the moisture attached to the additional member 110, the additional member 110 and the transporting container 120 may be placed in the lower airtight chamber 104 for a certain period of time. After the certain period of time has elapsed, the gate 72 is opened. In addition, there is a possibility that, during insertion of the additional member 110, the center axis of the rod 134 is deviated and atmospheric air flows into the upper airtight chamber 102. In order to prevent this, a member that guides the rod 134 may be provided at the bottom of the NMR probe. In addition, there is a possibility that, when the additional member 110 is inserted into the NMR probe, the temperatures of the top terminal mounting member 52 and the bottom terminal mounting member 56 are increased. In order to handle this, the additional member 110 may be left at the location for a certain period of time after the upper end of the additional member 110 reaches the bottom terminal mounting member 56, for heat exchange. For example, this operation may be executed while detecting the temperature by a temperature sensor provided on the NMR probe.

[Second Preferred Embodiment]

Figure 14:
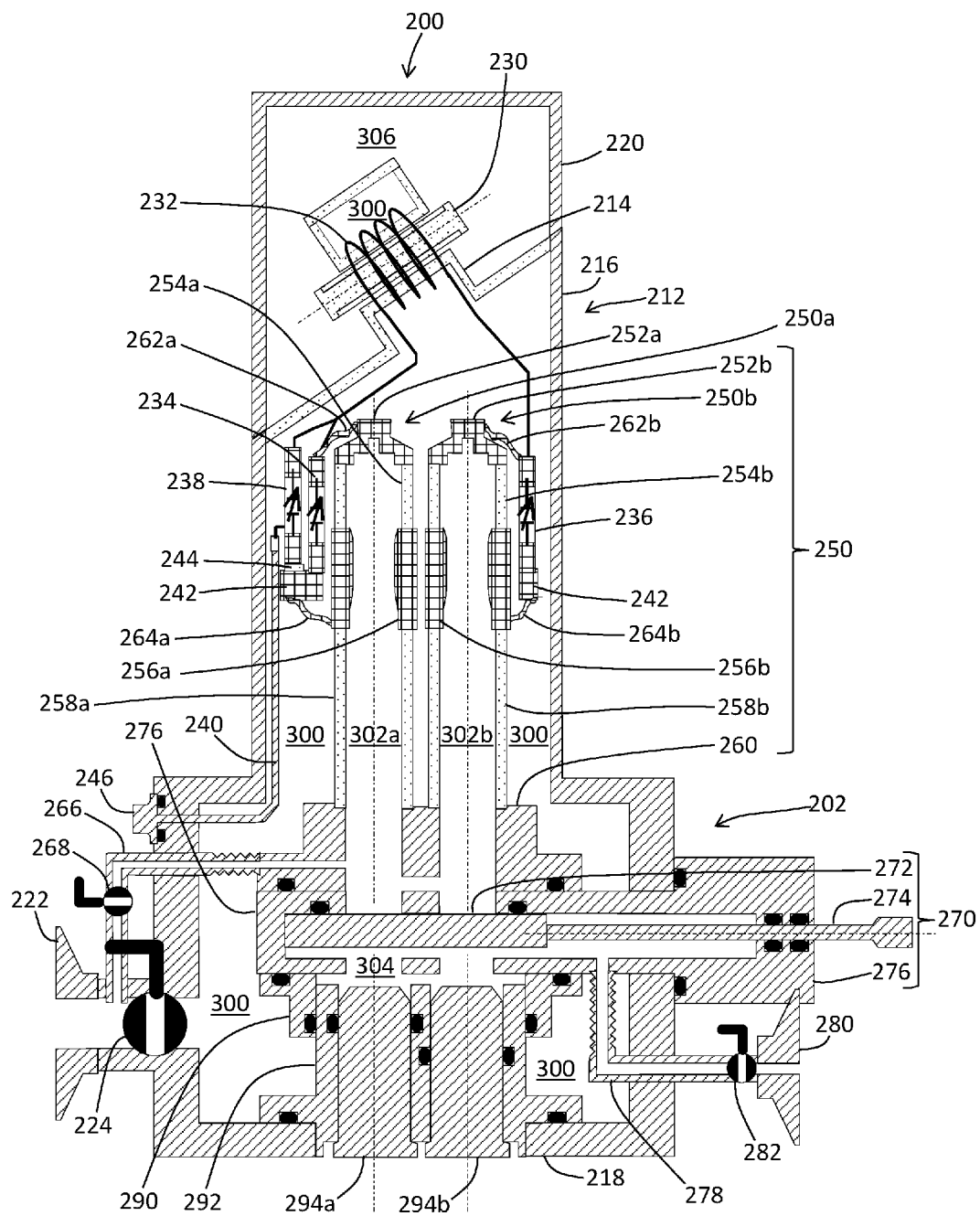
FIG. 14 is a cross sectional diagram of an NMR probe according to a second preferred embodiment of the present invention.

Next, an NMR probe according to a second preferred embodiment of the present invention will be described with reference to FIG. 14. FIG. 14 shows an example of the NMR probe according to the second preferred embodiment. In the NMR probe according to the second preferred embodiment, two tube bodies are placed spatially parallel to each other. With such a configuration, it becomes possible to add two additional members to two locations in the tank circuit from the outside of the NMR probe.

The NMR probe according to the second preferred embodiment comprises an insertion section 200 and a lower unit 202. The insertion section 200 has an overall tubular shape extending in the vertical direction, and is inserted in the bore 152 of the static magnetic field generation apparatus 150. The NMR probe includes an outer container 212, an inner container (container including a tube body 250) provided in the outer container 212, and a tank circuit (detection circuit) having a transmission and reception coil 232. The constituent elements of the NMR probe will now be described.

The additional member 110, the transporting container 120, and the stick 130 used in the second preferred embodiment have the same structures as those of the additional member 110, the transporting container 120, and the stick 130, respectively, in the first preferred embodiment.

The outer container 212 is a container having a probe head partition 214, a probe tubular section partition 216, and a probe lower partition 218. A primary airtight chamber 300 is a space surrounded by the outer container 212 and a primary valve 224. A pressure of the primary airtight chamber 300 is reduced to, for example, a pressure of less than or equal to $10^{-3}$ Pa at room temperature by attaching a pressure-reduction line (not shown) such as a vacuum pump to the NMR probe.

On an upper part of the probe head partition 214, a probe cap 220 is provided. The probe cap 220 is a tubular member provided at an uppermost part of the insertion section 200. The probe cap 220 is formed from, as an example, a metal conductor (for example, aluminum). At a lower part, the probe cap 220 is electrically and mechanically connected to the probe tubular section partition 216. With this configuration, influence of electromagnetic waves such as external noise on the transmission and reception coil 232 is prevented or reduced. As an example, a connection between the probe cap 220 and the probe tubular section partition 216 does not have airtightness. Therefore, a space 306 surrounded by the probe cap 220 and the probe head partition 214 is an atmospheric space.

The probe head partition 214 is a member that isolates the transmission and reception coil 232 from the atmospheric space, and secures the airtightness of the upper part of the insertion section 200. The probe head partition 214 is formed from, for example, a composite member. The probe head partition 214 is formed from, as an example, GFRP (glass fiber reinforced plastic) or ceramic which is an insulating material. The probe head partition 214 is airtightly connected to the probe tubular section partition 216 at its lower end surface.

The probe tubular section partition 216 is, for example, a partition having a tubular shape. When the insertion section 200 is mounted in the bore of the static magnetic field generation apparatus, the probe tubular section partition 216 is not placed at a position which can be accessed from the outside. The probe tubular section partition 216 is airtightly connected to the probe head partition 214 at its upper end surface, and is airtightly connected to the probe lower partition 218 at its lower end surface.

The probe lower partition 218 is, for example, a box-shaped partition. When the insertion section 200 is mounted in the bore of the static magnetic field generation apparatus, the probe lower partition 218 is placed at a position accessible from the outside. The probe lower partition 218 is airtightly connected to the probe tubular section partition 216 at its upper end surface.

A primary vacuum port 222 is provided on the probe lower partition 218. A pressure-reduction line such as a vacuum pump is attached to the primary vacuum port 222.

The primary valve 224 is a valve provided between the pressure-reduction line such as the vacuum pump connected to the primary vacuum port 222 and the primary airtight chamber 300. The primary valve 224 is, as an example, a two-port manual valve. Alternatively, the primary valve 224 may be a valve of another type. By operating the primary valve 224, it is possible to pneumatically connect or disconnect the primary airtight chamber 300 and the pressure-reduction line. For the vacuum pump, for example, a turbo molecular pump is used.

A tank circuit is provided at an upper part of the primary airtight chamber 300. The tank circuit is a detection circuit, and includes, in addition to the transmission and reception coil 232, a tuning variable capacitor and a matching variable capacitor. In other words, the tank circuit has a tuning circuit and a matching circuit. In the second preferred embodiment, the tank circuit includes the transmission and reception coil 232, a tuning variable capacitor 234, a balancing variable capacitor 236, and a matching variable capacitor 238. For example, the tuning circuit and the matching circuit are not independent from each other, and are in a relationship in which, when an operation condition of one circuit is changed, an operation condition of the other circuit is also changed. A structure of the tank circuit will now be described.

The transmission and reception coil 232 generates a varying RF magnetic field during transmission and detects an NMR signal of a sample during reception. Alternatively, in place of the transmission and reception coil 232, a separate transmission coil and reception coil may be provided. The tank circuit has a tuning variable capacitor and a matching variable capacitor, and operation characteristics of the detection circuit are optimized by changing the capacitances of the variable capacitors. That is, frequency tuning and impedance matching are achieved.

The insertion section 200 is placed in the bore of the static magnetic field generation apparatus such that a center of the sample and a sample tube 230 coincides with a center of the magnetic field. The sample and the sample tube 230 are placed in the space 306 (in the atmospheric space) surrounded by the probe cap 220 and the probe head partition 215. When the sample to be measured is solid, the sample tube is rotatably placed with an inclined orientation with a predetermined inclination angle (so-called magic angle, that is, about 54.7°). In the NMR probe, an air bearing-type rotation mechanism (not shown) is provided. When compressed air (for example, having a pressure of 0.2-0.4 MPa) is supplied to the air bearing-type rotation mechanism, the sample tube 230 is rotated. As an example, the sample tube 230 is rotated with a rotation number of few KHz to few tens of KHz.

The transmission and reception coil 232 is placed in the primary airtight chamber 300 under a reduced pressure vacuum, in a manner to surround the sample and the sample tube 230. The transmission and reception coil 232 has, for example, the shape of a solenoid. One end of the transmission and reception coil 232 is electrically connected to an upper terminal of the tuning variable capacitor 234. The other end of the transmission and reception coil 232 is electrically connected to an upper terminal of the balancing variable capacitor 236.

The upper terminal of the tuning variable capacitor 234 is electrically connected to an upper terminal of the matching variable capacitor 238. A lower terminal of the matching variable capacitor 238 is electrically connected to an upper end of a transmission path 240.

The tuning variable capacitor 234, the balancing variable capacitor 236, and the matching variable capacitor 238 are each formed from, for example, a tubular dielectric, and each has an electrode on an upper end and a lower end thereof. In an inner side space of the tube, a metal tube which slides in a vertical direction by rotation even when the member temperature changes from room temperature to the very low temperature is provided. The metal tube is electrically connected to the electrode at the lower end. For the variable capacitor, for example, a capacitor of a model number "NMCB10-5CKE" manufactured by Voltronics Corporation may be used. Alternatively, the three variable capacitors may have structures different from those described above.

The tuning variable capacitor 234 and the balancing variable capacitor 236 are both electrically connected to and mechanically supported by a stage 242 at their lower terminals, and are fixed thereto. The matching variable capacitor 238 is electrically insulated from the stage 242 with an insulating base 244 therebetween, and is mechanically supported by and fixed to the stage 242. With the use of an adjustment bar (not shown), the capacitance values of the three variable capacitors can be continuously changed from the outside of the NMR probe. With such a configuration, the frequency tuning and impedance matching are achieved.

Next, a structure of the inner container will be described. In the second preferred embodiment, the inner container has a structure of a duplex tube body system. The inner container is provided in the outer container 212, and extends from the bottom of the primary airtight chamber 300 to a region near the tank circuit positioned at an upper part of the primary airtight chamber 300.

In the inner container, a sub airtight chamber that exists independently from the primary airtight chamber 300 is formed. In this manner, the inner container is a container that separates the inside of the outer container 212 into the primary airtight chamber 300 and the sub airtight chamber.

The sub airtight chamber is a space for transporting and placing the additional member 110 from outside of the NMR probe (atmospheric space) into the NMR probe. The sub airtight chamber is separated into two upper airtight chambers (upper airtight chambers 302a and 302b) and a lower airtight chamber 304 by a valve or the like. The upper airtight chamber 302a and the upper airtight chamber 302b are pneumatically connected to each other, and these chambers may be considered as one airtight chamber in relation to the pneumatic operations.

The inner container includes three member groups (an upper partition, a middle partition, and a lower partition). The lower partition is placed and fixed above the inside of the probe lower partition 218. The middle partition is placed and fixed above the lower partition. The upper partition is placed and fixed above the middle partition. The member groups are connected or fixed to each other by O-ring seals (portions filled with black color in FIG. 14). The middle partition and the lower partition form a partition of the lower airtight chamber 304. The upper partition and the middle partition form partitions of the upper airtight chambers 302a and 302b. Structures of the upper partition, the middle partition, and the lower partition will now be described.

First, the upper partition will be described. The upper partition includes the duplex tube body 250, upper links 262a and 262b, lower links 264a and 264b, an upper aeration tube 266, and an upper valve 268. The upper partition pneumatically disconnects the upper airtight chambers 302a and 302b from the primary airtight chamber 300.

The duplex tube body 250 is formed from two tube bodies. Specifically, the duplex tube body 250 includes a first tube body 250a and a second tube body 250b. The first tube body 250a is electrically connected to the tuning variable capacitor 234, and the second tube body 250b is electrically connected to the balancing variable capacitor 236. The two tube bodies are placed in parallel to each other.

The first tube body 250a is a composite member in which a plurality of members (from top to bottom, a top terminal mounting member 252a, an upper insulating tube 254a, a bottom terminal mounting member 256a, a lower insulating tube 258a, and an upper duplex cylinder 260) having a tubular shape with approximately the same inner size are overlapped and integrated. The first tube body 250a has in the inside a circular column shaped space in which an upper end is closed and a lower end is opened. This space corresponds to the upper airtight chamber 302a. The circular column shaped space (upper airtight chamber 302a) has approximately constant diameter. The diameter of this space is slightly larger than an outer size of the additional member 110. With this configuration, it is possible for the additional member 110 to move within the upper airtight chamber 302a. The first tube body 250a has a function to mechanically hold the additional member 110 inserted from the outside of the NMR probe and a function to electrically connect the additional member 110 to the tank circuit.

The second tube body 250b is a composite member in which a plurality of members (from top to bottom, a top terminal mounting member 252b, an upper insulating tube 254b, a bottom terminal mounting member 256b, a lower insulating tube 258b, and the upper duplex cylinder 260) having a tubular shape with approximately the same inner size are overlapped and integrated. The second tube body 250b has in the inside a circular column shaped space in which an upper end is closed and a lower end is opened. This space corresponds to the upper airtight chamber 302b. The circular column shaped space (upper airtight chamber 302b) has an approximately constant diameter. The diameter of this space is slightly larger than an outer size of the additional member 110. With this configuration, it is possible for the additional member 110 to move within the upper airtight chamber 302b. The second tube body 250b has a function to mechanically hold the additional member 110 inserted from the outside of the NMR probe and a function to electrically connect the additional member 110 to the tank circuit.

The top terminal mounting members 252a and 252b are circular column shaped members. On the inner sides of lower end surfaces of the top terminal mounting members 252a and 252b, recesses having a leaf spring structure are formed. To each of these recesses, the protrusion 116l of the top terminal 116 of the additional member 110 is fitted. The lower end surfaces of the top terminal mounting members 252a and 252b are airtightly fixed to upper end surfaces of the upper insulating tubes 254a and 254b, respectively, by adhesion. In order to maintain a surface resistance and a connection point resistance low, the top terminal mounting members 252a and 252b may be formed from, for example, gold-plate processed oxygen-free copper.

The upper insulating tubes 254a and 254b are members having a tubular shape with a relatively short length. The upper end surfaces of the upper insulating tubes 254a and 254b are airtightly fixed to the lower end surfaces of the top terminal mounting members 252a and 252b, respectively, by adhesion. Lower end surfaces of the upper insulating tubes 254a and 254b are airtightly fixed on upper end surfaces of the bottom terminal mounting members 256a and 256b, respectively, by adhesion. In order to electrically and thermally insulate between the top terminal mounting members 252a and 252b and the bottom terminal mounting members 256a and 256b, the upper insulating tubes 254a and 254b are formed from, for example, GFRP and ceramic.

The bottom terminal mounting members 256a and 256b are members having tubular shapes. On an inner circumferential surface of the tube, a leaf spring is provided. The additional member 110 is sandwiched and held by the leaf spring. Lower end surfaces of the bottom terminal mounting members 256a and 256b are adhered to upper ends of the lower insulating tubes 258a and 258b, respectively. In order to maintain the surface resistance and the connection point resistance low, the bottom terminal mounting members 256a and 256b may be formed from, for example, gold-plate processed, oxygen-free copper.

The lower insulating tubes 258a and 258b are tubular shaped members having relatively long lengths. The lower insulating tubes 258a and 258b correspond to an intermediate tubular section of the NMR probe. Lower end surfaces of the lower insulating tubes 258a and 258b are airtightly fixed on an upper surface of the upper duplex cylinder 260 by adhesion. In order to electrically and thermally insulate between the bottom terminal mounting members 256a and 256b and the upper duplex cylinder 260, the lower insulating tubes 258a and 258b are formed from, for example, GFRP or ceramic.

The upper duplex cylinder 260 is a member having a protruding shape, and is placed such that the protrusion faces upward. The upper duplex cylinder 260 has two vertical through holes which are arranged in parallel to each other. Each through hole has a tubular shape. In order to not affect the uniformity of the magnetic field, the upper duplex cylinder 260 is formed from, for example, a non-magnetic stainless steel material. The upper end surface of the upper duplex cylinder is airtightly fixed on the lower end surfaces of the lower insulating tubes 258a and 258b by adhesion. A lower end flange surface of the upper duplex cylinder 260 is mechanically fixed on an outer surface of an upper part of a duplex gate valve housing 276 via an O-ring seal. With such a configuration, the airtightness is secured.

On the upper end surface of the top terminal mounting member 252a, the upper link 262a is provided. The upper link 262a is a plate-shaped member, and electrically connects between the upper end surface of the top terminal mounting member 252a and a terminal of the tuning variable capacitor 234. In order to reduce application of a force puling the stage 242 downward by a contraction stress acting on the first tube body 250a when the tank circuit is cooled, the upper link 262a is preferably formed from, for example, a gold-plated copper foil having plasticity (for example, having a thickness of 0.05 mm-0.1 mm).

On an outer circumferential surface of the bottom terminal mounting member 256a, the lower link 264a is provided. The lower link 264a is a plate-shaped member, and electrically connects between the outer circumferential surface of the bottom terminal mounting member 256a and the stage 242. With such a configuration, the bottom terminal mounting member 256a and the tuning variable capacitor 234 are electrically connected to each other. In order to reduce application of a force pulling the stage 242 downward by a contraction stress acting on the first tube body 250a when the tank circuit is cooled, the lower link 264a is preferably formed from, for example, a gold-plated copper foil having plasticity (for example, having a thickness of 0.05 mm-0.1 mm).

On an upper end surface of the top terminal mounting member 252b, the upper link 262b is provided. The upper link 262b is a plate-shaped member, and electrically connects between the upper end surface of the top terminal mounting member 252b and a terminal of the balancing variable capacitor 236. In order to reduce application of a force pulling the stage 242 downward by a contraction stress acting on the second tube body 250b when the tank circuit is cooled, the upper link 262b is preferably formed from, for example, a gold-plated copper foil having plasticity (for example, having a thickness of 0.05 mm-0.1 mm).

On an outer circumferential surface of the bottom terminal mounting member 256b, the lower link 264b is provided. The lower link 264b is a plate-shaped member, and electrically connects between the outer circumferential surface of the bottom terminal mounting member 256b and the stage 242. With such a configuration, the bottom terminal mounting member 256b and the balancing variable capacitor 236 are electrically connected to each other. In order to reduce application of a force pulling the stage 242 downward by a contraction stress acting on the second tube body 250b when the tank circuit is cooled, the lower link 264b is preferably formed from, for example, a gold-plated copper foil having plasticity (for example, having a thickness of 0.05 mm-0.1 mm).

The upper aeration tube 266 is, for example, a flexible tube (for example, a bellows tube). One end of the upper aeration tube 266 is airtightly joined with respect to an inside space of the upper duplex cylinder 260; that is, the upper airtight chambers 302a and 302b. The other end of the upper aeration tube 266 is opened to the primary airtight chamber 300.

The upper valve 268 is a valve airtightly placed on the upper aeration tube 266. The upper valve 268 is, as an example, a two-port manual valve. Alternatively, the upper valve 268 may be a valve of another type. By operating the upper valve 268, the aeration line of the upper aeration tube 266 can be connected or disconnected.

Next, the middle partition will be described. The middle partition includes a duplex gate valve 270, a lower aeration tube 278, and a lower valve 282. The middle partition pneumatically disconnects or connects the upper airtight chambers 302a and 302b and the lower airtight chamber 304 by a mechanical operation.

The duplex gate valve 270 is a composite member including a gate 272, a lever 274, and the duplex gate valve housing 276.

The duplex gate valve housing 276 is mechanically fixed at an upper part to the upper duplex cylinder 260 included in the upper partition, via an O-ring seal. With this configuration, airtightness is secured. The duplex gate valve housing 276 is mechanically fixed at a lower part to a middle duplex cylinder 290 included in the lower partition via an O-ring seal. With this configuration, airtightness is secured. The operator can pneumatically connect or disconnect between the upper airtight chambers 302a and 302b and the lower airtight chamber 304 by sliding the gate 272 via the lever 274.

The gate 272 is a plate-shaped member placed inside the duplex gate valve housing 276. The gate 272 has a shape of, for example, a rectangle. The gate 272 is formed from, for example, a non-magnetic stainless steel material. An upper surface of the gate 272 is a flange surface. When the gate 272 is slid to the deepest position, the gate 272 is pressed against an O-ring seal placed inside an upper surface of the duplex gate valve housing 276. With this process, the upper airtight chambers 302a and 302b and the lower airtight chamber 304 are pneumatically disconnected.

The lever 274 is, for example, a round bar, and is provided through a through hole of a double O-ring seal provided at an atmosphere side of the duplex gate valve housing 276. One end of the lever 274 protrudes to the atmosphere side. The other end of the lever 274 is mechanically connected to a side surface of the gate 272 at an inside of the duplex gate valve housing 276. The lever 274 is formed from, for example, a non-magnetic stainless steel material.

The duplex gate valve housing 276 is a rectangular parallelepiped shaped box having a flange surface. In an inside space of the duplex gate valve housing 276, the gate 272 and a part of the lever 274 mechanically connected to the gate 272 are stored. The duplex gate valve housing 276 is formed from, for example, a non-magnetic stainless steel material. The duplex gate valve housing 276 is inserted in a lateral direction from the side surface of the NMR probe, and is fixed on the side surface at the flange surface via an O-ring seal. The duplex gate valve housing 276 has two vertical through holes having a tubular shape arranged in parallel to each other at a deep position. The through holes are placed coaxial with the through holes of the upper duplex cylinder 260, respectively, and the through holes of the middle duplex cylinder 290, respectively. The hole size of each through hole of the duplex gate valve housing 276 is larger than the outer size of the additional member 110, and is a size that allows the additional member 110 to pass without an obstruction. In addition, the hole size of each through hole of the duplex gate valve housing 276 is smaller than the outer size of the transporting container 120. With such a configuration, the transporting container 120 cannot pass through the duplex gate valve housing 276.

The lower aeration tube 278 is, for example, a flexible tube (for example, a bellows tube). One end of the lower aeration tube 278 is airtightly connected to the inside of the duplex gate valve housing 276. The other end of the lower aeration tube 278 is connected to a sub vacuum port 280 provided outside of the NMR probe. The lower aeration tube 278 is formed from, for example, a non-magnetic stainless steel material.

The sub vacuum port 280 is provided outside of the NMR probe, and a pressure-reduction line such as a vacuum pump is attached thereto.

The lower valve 282 is a valve pneumatically placed on the lower aeration tube 278. The lower valve 282 is, as an example, a two-port manual valve. Alternatively, the lower valve 282 may be a valve of another type. The aeration line of the lower aeration tube 278 can be connected or disconnected by operating the lower valve 282.

Next, the lower partition will be described. The lower partition includes the middle duplex cylinder 290, a lower duplex cylinder 292, and insertion hole plugs 294a and 294b. The lower partition pneumatically disconnects the lower airtight chamber 304 from the atmosphere.

The middle duplex cylinder 290 is a member having a protruding shape, and is placed such that the protrusion faces downward. In addition, the middle duplex cylinder 290 has two vertical through holes arranged in parallel to each other. Each through hole has a tubular shape. The middle duplex cylinder 290 is formed from, for example, a non-magnetic stainless steel member. The middle duplex cylinder 290 is mechanically fixed at an upper part to the duplex gate valve housing 276 included in the middle partition, via an O-ring seal. With this configuration, airtightness is secured. A groove for the O-ring is formed on an inner circumferential surface at a lower part of the middle duplex cylinder 290, and an O-ring seal is provided in the groove. When a lower duplex cylinder 292 is inserted into the through hole of the middle duplex cylinder 290, the inner circumferential surface of the middle duplex cylinder 290 is airtightly connected to an outer circumferential surface of the lower duplex cylinder 292 via the O-ring seal. With this configuration, airtightness is secured.

The lower duplex cylinder 292 is a member having a protruding shape, and is placed such that the protrusion faces upward. The lower duplex cylinder 292 has two vertical through holes arranged in parallel to each other. Each through hole has a tubular shape. The lower duplex cylinder 292 is formed from, for example, a non-magnetic stainless steel material. The lower duplex cylinder 292 is mechanically fixed at a lower part to an inside of a bottom surface of the probe lower partition 218 via an O-ring seal. With this configuration, airtightness is secured. A groove for an O-ring is formed at an upper part of an inner circumferential surface of the lower duplex cylinder 292, and an O-ring seal is provided in the groove. When the insertion hole plugs 294a and 294b are inserted into the through holes of the lower duplex cylinder 292, the inner circumferential surfaces of the lower duplex cylinder 292 are airtightly connected with outer circumferential surfaces of the insertion hole plugs 294a and 294b via the O-ring seal. On a lower part of the inner circumferential surface of the lower duplex cylinder 292, a thread groove is formed for fixing the insertion hole plugs 294a and 294b. At a lower part on the outer circumferential surfaces of the insertion hole plugs 294a and 294b, thread grooves corresponding to the thread groove of the lower duplex cylinder 292 are formed. The hole size of each through hole of the lower duplex cylinder 292 is slightly larger than the outer size of the transporting container 120. With this configuration, the transporting container 120 is inserted into each through hole of the lower duplex cylinder 292. In this process, the inner circumferential surface of the lower duplex cylinder 292 is airtightly connected to the outer circumferential surface of the transporting container 120 via an O-ring seal.

The insertion hole plugs 294a and 294b are, for example, members having a circular column shape. An upper part of an outer circumferential surface of each of the insertion hole plugs 294a and 294b is smoothly formed. At a lower part of the outer circumferential surface, the thread groove is formed. As described above, the thread groove corresponds to the thread groove formed in the lower duplex cylinder 292. The insertion hole plugs 294a and 294b are formed from, for example, a non-magnetic stainless steel material. On bottom surfaces of the insertion hole plugs 294a and 294b, for example, a dial section is provided. It is possible to pneumatically connect or disconnect between the atmosphere and the lower airtight chamber 304 by rotationally operating the insertion hole plugs 294a and 294b from outside of the NMR probe.

In the above-described structure, the tank circuit (transmission and reception coil 232 and the variable capacitor), the top terminal mounting members 252a and 252b, the upper insulating tubes 254a and 254b, the bottom terminal mounting members 256a and 256b, and regions of the lower insulating tubes 258a and 258b near the joints with the bottom terminal mounting members 256a and 256b are cooled to the very low temperature. These members correspond to the members to be cooled, and are cooled by a cooling mechanism (not shown). For the cooling mechanism, the same mechanism as that of the first preferred embodiment is employed. In addition, similar to the first preferred embodiment, a mechanism for avoiding the disadvantages during low-temperature operation is employed. That is, the first tube bodies 250a and 250b are mechanically fixed only with respect to the probe lower partition 218 through the mechanical fixation with respect to the middle partition and the lower partition, and are not mechanically fixed with respect to the stage 242. In addition, the top terminal mounting members 252a and 252b and the tank circuits are electrically connected by the upper links 262a and 262b. The bottom terminal mounting members 256a and 256b and the tank circuits are electrically connected by the lower links 264a and 264b. With such a configuration, mechanical disadvantage during low-temperature operation can be avoided.

In the second preferred embodiment also, with a procedure similar to that of the first preferred embodiment, the additional member 110 can be added to the tank circuit or the additional member 110 can be removed from the tank circuit.

If two single tube body type NMR probes (for example, the NMR probe according to the first preferred embodiment) are provided, the number of the valves would be increased, and the operation required for adding or removing the additional member would become complicated. In addition, the number of components would be increased and an amount of space occupied by the NMR probe would be increased. According to the second preferred embodiment, it becomes possible to add two additional members to the tank circuit by one operation, and with the same number of valves as with the single tube body type NMR probe. In addition, by integrating members that can be integrated, it becomes possible to reduce the space in the NMR probe.

In the second preferred embodiment, the two additional members 110 may be simultaneously added to the tank circuit or one additional member 110 may be added to the tank circuit. For example, the number of additional members 110 may be changed according the intended measurement usage. The two additional members 110 may be integrated or may be separate entities.

Alternatively, three or more tube bodies may be provided on the NMR probe, to enable addition of three or more additional members 110 to the tank circuit.

Figure 15A:
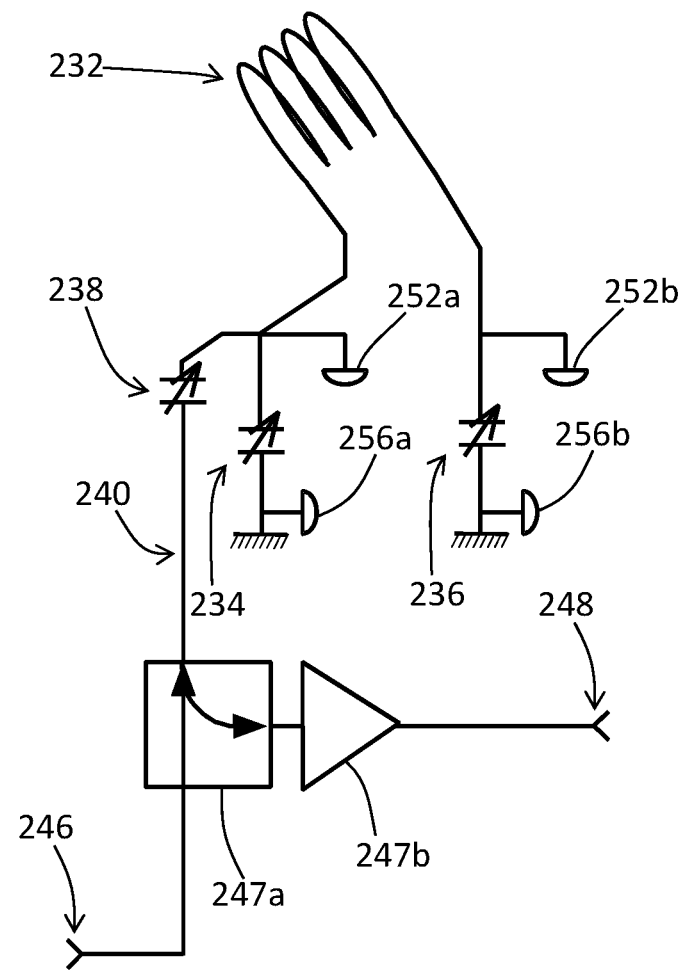
FIG. 15A is an electrical circuit diagram of a tank circuit according to the second preferred embodiment of the present invention.
Figure 15B:
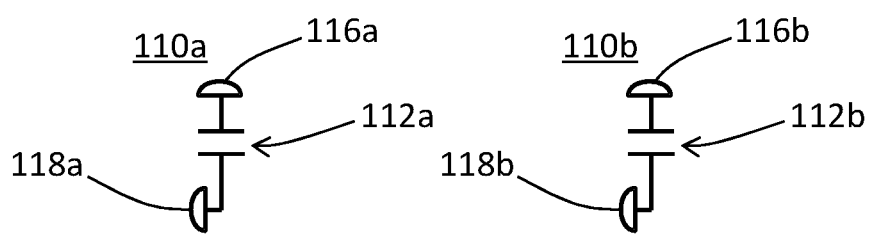
FIG. 15B is an electrical circuit diagram of the tank circuit according to the second preferred embodiment of the present invention.
Figure 15C:
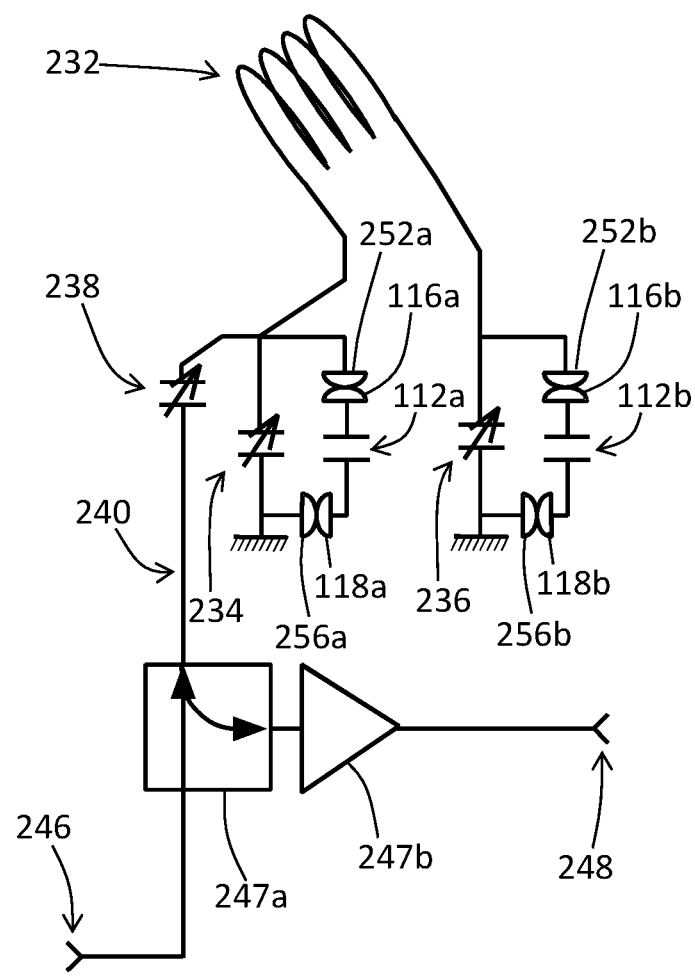
FIG. 15C is an electrical circuit diagram of the tank circuit according to the second preferred embodiment of the present invention.

The tank circuit according to the second preferred embodiment will now be described with reference to FIGS. 15A, 15B, and 15C. FIGS. 15A, 15B, and 15C are electrical circuit diagrams.

FIG. 15A shows the tank circuit in a state where the additional member 110 is not added. The transmission path 240 is electrically connected to a transmission port 246 or a reception port 248 via circuit elements (a duplexer 247a and a pre-amplifier 247b). With this configuration, transmission of radio waves and reception of the NMR signal are executed between the NMR probe and the NMR spectrometer provided outside of the NMR probe. The functions of the duplexer 247a and pre-amplifier 247b are identical to the functions of the duplexer 47a and the pre-amplifier 47b of the first preferred embodiment.

In the tank circuit shown in FIG. 15A, when the inductance of the transmission and reception coil 232 is $L_S$, and the capacitances of the tuning variable capacitor 234, the balancing variable capacitor 236, and the matching variable capacitor 238 are $C_T$, $C_B$, and $C_M$, respectively, the resonance frequency $f_a$ for minimizing the impedance is represented by the above-described Equation (1). Because the inductance $L_S$ is a fixed value, the range of the frequency that can be tuned is limited by $C_T$ and $C_M$, which are variable values.

FIG. 15B shows circuit structures of the additional members 110a and 110b. Reference numerals 112a and 112b represent additional elements (capacitors). Reference numerals 116a and 116b represent top terminals, and reference numerals 118a and 118b represent bottom terminals.

FIG. 15C shows the tank circuit in a state where the additional members 110a and 110b are added. For example, the top terminal 116a of the additional member 110a is electrically connected to the top terminal mounting member 252a, and the bottom terminal 118a is electrically connected to the bottom terminal mounting member 256a. In this manner, the additional element 112a (capacitor) is connected in parallel to the tuning variable capacitor 234. In addition, the top terminal 116b of the additional member 110b is electrically connected to the top terminal mounting member 252b, and the bottom terminal 118b is electrically connected to the bottom terminal mounting member 256b. In this manner, the additional member 112b (capacitor) is connected in parallel to the balancing variable capacitor 236. When the capacitance of the additional element 112a is $C_X$ and the capacitance of the additional element 112b is $C_Y$, a resonance frequency $f_c$ that minimizes the impedance in this tank circuit is represented by the following Equation (3).

[Equation 3]

$$f_c = \frac{1}{2\pi\sqrt{L_S\left\{\frac{(C_T+C_X)(C_B+C_Y)}{C_T+C_X+C_B+C_Y}\right\}}} \quad (3)$$

Because the inductance $L_S$ is a fixed value, the range of the frequency that can be tuned is limited by $(C_T+C_X)$ and $(C_B+C_Y)$, which are variable values. Because $C_X$ and $C_Y$ may take any arbitrary fixed values by exchanging the additional elements 112a and 112b, frequencies in various frequency ranges can be tuned.

Meanwhile, the matching with respect to the characteristic impedance $Z_0$ of the impedance of the tank circuit is adjusted by the matching variable capacitor 238.

In the tank circuit, both terminals of the transmission and reception coil are connected to the ground via capacitors. Here, if resonance is caused under a condition where the capacitance of the capacitor connected to one terminal and the capacitance of the capacitor connected to the other terminal are coincident, an intensity difference of the amplitude of the high-frequency voltage at both ends of the transmission and reception coil is maximized. With such a configuration, the current flowing through the transmission and reception coil is maximized, and, as a result, the magnetic field induced at the center of the transmission and reception coil is maximized and the transmission and reception efficiency of the NMR signal of the sample is maximized.

In the second preferred embodiment, the additional members (two additional members) connected to both ends of the transmission and reception coil 232, respectively, can be exchanged to realize the tuning and matching. In this manner, it is possible to not only simply expand the tuning range to a wide range, but also optimize the transmission and reception efficiency of the NMR signal.

Next, advantages that can be obtained by expanding the tuning range of the tank circuit will be described. As a sample expected to serve as a measurement target of the NMR probe according to the first or second preferred embodiment, nuclear species that belong to a very low frequency band may be exemplified. Many inorganic nuclear species have a low magnetic rotation ratio, and the Larmor frequencies thereof in many cases belong to a frequency band lower than a minimum frequency (30 MHZ) for which the technique of U.S. Pat. No. 7,701,219 can be set. For these nuclear species, the NMR sensitivity is very low. With the use of the NMR probe according to the first or second preferred embodiment, improvement in the sensitivity can be expected.

Because the capacitance range that can be varied by the variable capacitor is constant, as the resonance frequency of the tank circuit is lowered, the tuning range is also narrowed. In such bands, for example, a case may arise in which the tuning range is set every 1 MHz or 2 MHz. In the first and second preferred embodiments, because the additional element 112 can be arbitrarily changed, a tuning range optimum for individual nuclear species can be set, and application to nuclear species belonging to the low frequency band can be expected.

According to the first and second preferred embodiments, the detection sensitivity (SN ratio) of the NMR signal can be improved to three-four times that of the related art. The detection sensitivity of three-four time means that, when the NMR measurement of the same sensitivity is executed, the measurement time can be shortened to $1/9$-$1/16$ times. That is, it is possible to complete a measurement within 2 days, while in the related art, the measurement would have taken one month.

For example, when $^6$Li was measured using the detection system cool-type NMR probe according to the first or second preferred embodiment, a sensitivity of 4 times or greater with respect to the measurement sensitivity of the NMR probe of the related art was obtained. In addition, $^6$Li-$^6$Li two-dimensional distance correlation NMR measurement was executed according to a plurality of measurement conditions in a very short period of time using the NMR probe of the present embodiment, and new knowledge was obtained within a practical measurement time with regard to electron structure information of $LiCoO_2$, which is a typical lithium ion battery material.

In addition to $^6$Li, many nuclear species such as, for example, $^{47}$Ti (nuclear species existing in a catalyst or the like), $^{33}$S (nuclear species existing in functional materials and rubber), and $^{14}$N (nuclear species existing in many organic molecules) require enormous measurement time at low sensitivity. Because of this, it has been difficult to measure these nuclear species from the practical point of view. With the use of the NMR probe according to the present embodiments, these nuclear species are also expected to be measured within the practical measurement period. As described, the NMR probe of the present embodiment is expected for application not only to organic substances, but also to inorganic substances and composite materials.

As an alternative configuration of the first and second preferred embodiments, a non-cool-type NMR probe may be used. Alternatively, an NMR probe in which the primary airtight chamber and the sub airtight chamber are opened to the atmosphere; that is, an NMR probe which is not in the vacuum state, may be used. In these NMR probes also, the additional member can be added to the NMR probe in a state where the insertion section is inserted into the bore 152 of the static magnetic field generation apparatus 150.

In addition, as a means for transporting the additional member, members such as a wire, a wheel, or a belt may be used in place of the stick 130.

Alternatively, the capacitor switch described in U.S. Pat. No. 7,701,219 may be applied to the NMR probe according to the first or second preferred embodiment. In other words, a capacitor switch having a plurality of capacitors with different capacitances may be provided in the NMR probe. For example, the tuning range of the tank circuit may be changed using the capacitor switch, and in the case where the tuning range cannot be changed with the capacitor switch, the additional member 110 may be added from the outside of the NMR probe to further expand the tuning range of the tank circuit.

What is claimed is:
1. An NMR probe comprising:
   an outer container;
   an inner container provided in the outer container and that separates an inside of the outer container into a primary space and a sub space serving as a passageway;
   a basic electronic circuit placed in the primary space and that includes an NMR detection element; and
   an additional member placed in the sub space in a manner to allow insertion and removal during a tuning range change in which a tuning range of the basic electronic circuit is changed, and that has at least one additional element that is electrically connected to the basic electronic circuit in a state of being placed in the sub space.
2. The NMR probe according to claim 1, wherein
   the primary space is formed as an airtight space, and
   the NMR probe further comprises a cooling mechanism that cools the basic electronic circuit and the additional member.
3. The NMR probe according to claim 1, further comprising:
   a plug provided at an entrance/exit of the sub space and that opens and closes the entrance/exit; and a gate provided in the sub space between a holding position of the additional member, where the additional element is electrically connected to the basic electronic circuit, and the entrance/exit and that opens and closes partway in the sub space, wherein in its closed state the gate separates the sub space into a first space having the holding position and a second space on the entrance/exit side.

4. The NMR probe according to claim 3, further comprising:

a first suctioning unit that suctions an inside of the first space; and a second suctioning unit that suctions an inside of the second space.

5. The NMR probe according to claim 1, wherein the additional member includes a body, a one-side electrode, and an other-side electrode, and the NMR probe further comprises:

a one-side connection member that connects the one-side electrode to a first connection point of the basic electronic circuit in a state where the additional member is placed in a holding position in the sub space; and an other-side connection member that connects the other-side electrode to a second connection point of the basic electronic circuit in a state where the additional member is placed in the holding position.

6. The NMR probe according to claim 1, further comprising:

a plug that blocks an entrance/exit of the sub space while allowing movement of the additional member within the sub space in a state where the additional member is inserted into the sub space.

7. The NMR probe according to claim 1, wherein the NMR probe comprises a plurality of the inner containers, a plurality of the sub spaces are formed by the plurality of the inner containers, and the additional member is placed in a manner to allow insertion and removal in each of the plurality of the sub spaces.

* * * * *